United States Patent
Kumar et al.

(10) Patent No.: US 9,953,697 B2
(45) Date of Patent: Apr. 24, 2018

(54) VOLATILE MEMORY DEVICE EMPLOYING A RESISTIVE MEMORY ELEMENT

(71) Applicant: SANDISK TECHNOLOGIES LLC, Plano, TX (US)

(72) Inventors: Tanmay Kumar, Pleasanton, CA (US); Alper Ilkbahar, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/251,818

(22) Filed: Aug. 30, 2016

(65) Prior Publication Data

US 2017/0309324 A1    Oct. 26, 2017

Related U.S. Application Data

(60) Provisional application No. 62/327,292, filed on Apr. 25, 2016.

(51) Int. Cl.
*G11C 11/4091* (2006.01)
*H01L 45/00* (2006.01)
(Continued)

(52) U.S. Cl.
CPC ...... *G11C 11/4091* (2013.01); *G11C 13/0007* (2013.01); *G11C 13/0033* (2013.01); *H01L 27/249* (2013.01); *H01L 45/08* (2013.01); *H01L 45/12* (2013.01); *H01L 45/1226* (2013.01); *H01L 45/146* (2013.01); *G11C 13/004* (2013.01)

(58) Field of Classification Search
CPC .................................................. G11C 11/4091

USPC ........................................................ 365/148
See application file for complete search history.

(56) References Cited

U.S. PATENT DOCUMENTS

| 5,915,167 | A |   | 6/1999 | Leedy |          |
| 6,064,588 | A | * | 5/2000 | Crafts | G11C 5/14 |
|           |   |   |        |        | 365/149   |

(Continued)

FOREIGN PATENT DOCUMENTS

WO    WO2007-004843 A1    1/2007

OTHER PUBLICATIONS

Govoreanu, et al., Vacancy-Moudulated Condcutive Oxide Resistive RAM (VMCO-RRAM): An Area-Scalable Switching Current, Self Compliant, High Nonlearn and Wide On/Off-Window Resistive Swtiching Cell, IEDM13, 2013, pp. 256-259, Leuven-Belguim.*

(Continued)

*Primary Examiner* — Hoai V Ho
*Assistant Examiner* — Muna A Techane
(74) *Attorney, Agent, or Firm* — The Marbury Law Group PLLC

(57) ABSTRACT

A volatile resistive memory device includes a resistive memory element including a barrier material portion and a charge-modulated resistive memory material portion. The barrier material portion includes a material selected from germanium and a silicon-germanium alloy, and the charge-modulated resistive memory material portion includes a non-filamentary, electrically conductive metal oxide. The resistive memory device may be a volatile eDRAM device. In operation, reading a resistance state of the resistive memory element does not disturb the resistance state of the charge-modulated resistive memory material portion.

6 Claims, 29 Drawing Sheets

(51) Int. Cl.
*H01L 27/24* (2006.01)
*G11C 13/00* (2006.01)

(56) References Cited

U.S. PATENT DOCUMENTS

| | | | |
|---|---|---|---|
| 7,800,934 B2 | 9/2010 | Kumar et al. | |
| 9,343,507 B2 | 5/2016 | Takaki | |
| 9,437,658 B2 | 9/2016 | Sakotsubo | |
| 2008/0117663 A1* | 5/2008 | Philipp | G11C 7/04 365/148 |
| 2010/0238704 A1 | 9/2010 | Komura et al. | |
| 2011/0157976 A1* | 6/2011 | Kuriyama | G05F 1/563 365/185.2 |
| 2012/0155168 A1* | 6/2012 | Kim | G11C 5/14 365/185.03 |
| 2012/0292584 A1* | 11/2012 | Rocklein | H01L 45/08 257/2 |
| 2012/0320656 A1* | 12/2012 | Chung | G11C 11/56 365/96 |
| 2012/0327724 A1* | 12/2012 | Kawakubo | G11C 8/08 365/189.07 |
| 2013/0043455 A1 | 2/2013 | Bateman | |
| 2013/0250664 A1* | 9/2013 | Takizawa | G11C 5/148 365/158 |
| 2014/0269002 A1 | 9/2014 | Jo | |
| 2015/0084671 A1* | 3/2015 | Prenat | H03K 19/0033 326/9 |
| 2015/0263069 A1 | 9/2015 | Jo | |
| 2016/0043143 A1 | 2/2016 | Sakotsubo | |

OTHER PUBLICATIONS

Zhang.L,et al., "Study of the Selector Element for Resistive Memory", Ku Leuven, vol. 62 No. 11, Oct. 8, 2015, pp. 1-232.*
International Search Report and Written Opinion of the International Searching Authority for International Patent Application No. PCT/US2017/017954 dated May 17, 2017, 13 pages.
Govoreanu, et al., Vacancy-Modulated Conductive Oxide Resistive RAM (VMCO-RRAM): An Area-Scalable Switching Current, Self Compliant, Highly Nonlinear and Wide On/Off- Window Resistive Switching Cell, IEDM13, 2013, pp. 256-259, Leuven-Belgium.
S.H. Jo et al., "Cross-Point Resistive RAM Based on Field-Assisted Superlinear Threshold Selector", IEEE Transactions on Electron Devices, vol. 62 No. 11, Nov. 2015, pp. 3477-3481.
L. Zhang, "Study of the Selector Element for Resistive Memory"), Ku Leuven Arenberg Doctoral School-Faculty of Engineering of Science, Oct. 2015, pp. 232, Haverly-Belgium.
U.S. Appl. No. 15/157,945, filed May 18, 2016, SanDisk Technologies LLC.
U.S. Appl. No. 15/228,216, filed Aug. 4, 2016, SanDisk Technologies LLC.

* cited by examiner

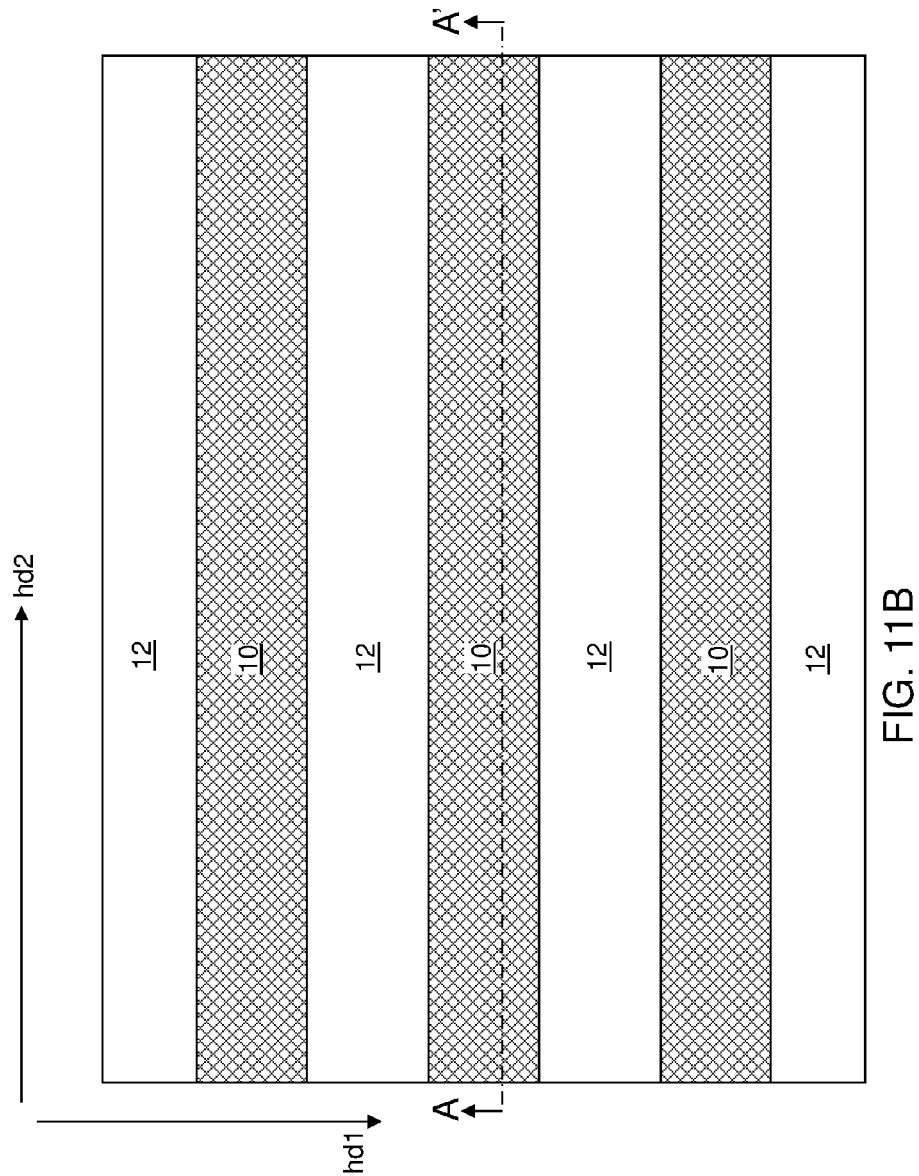

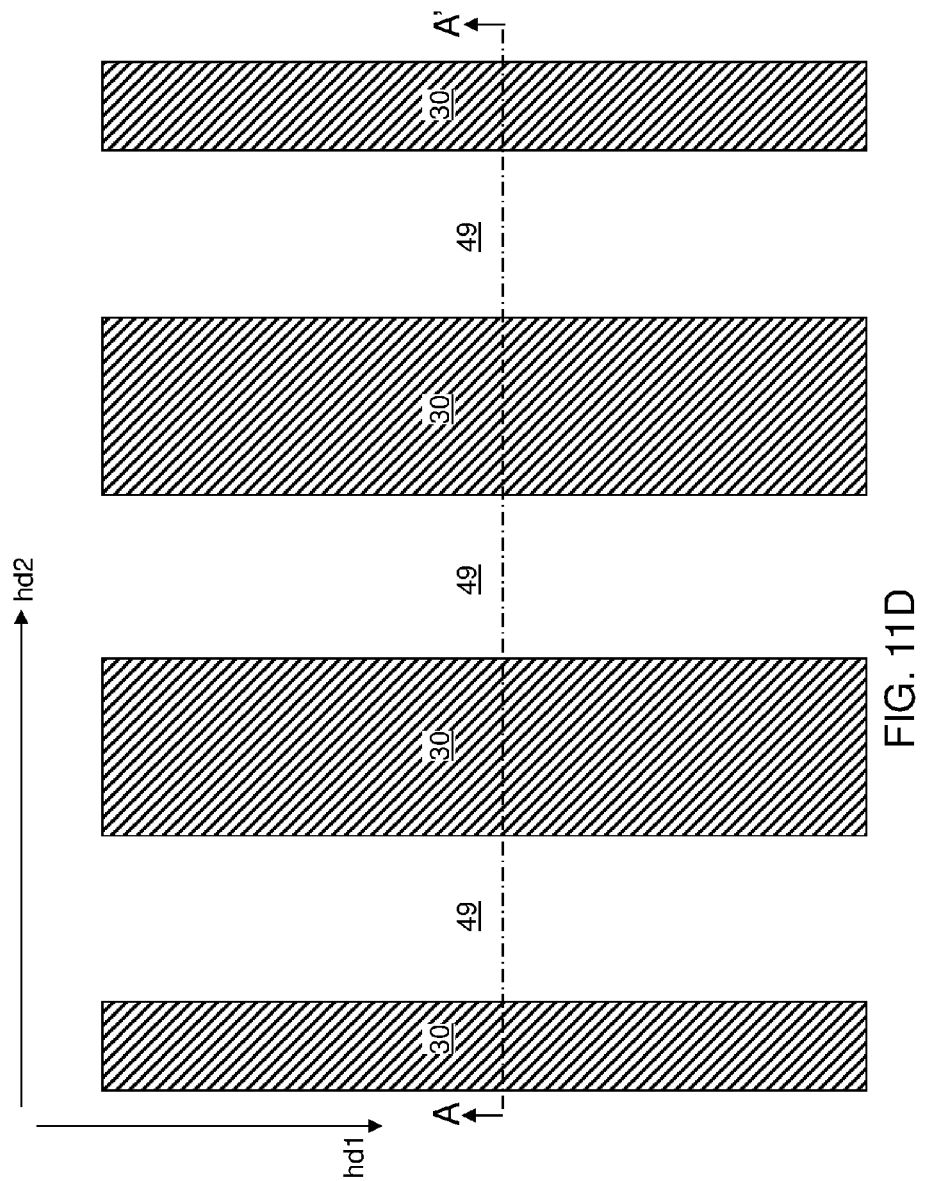

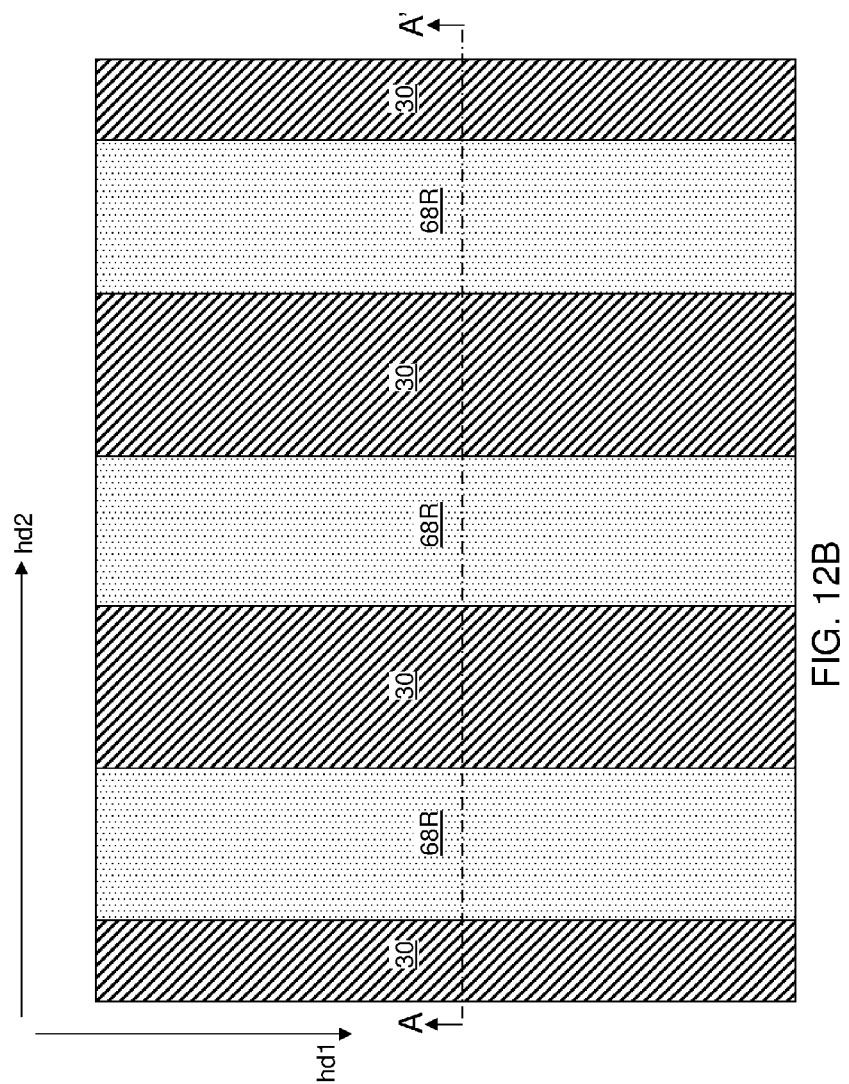

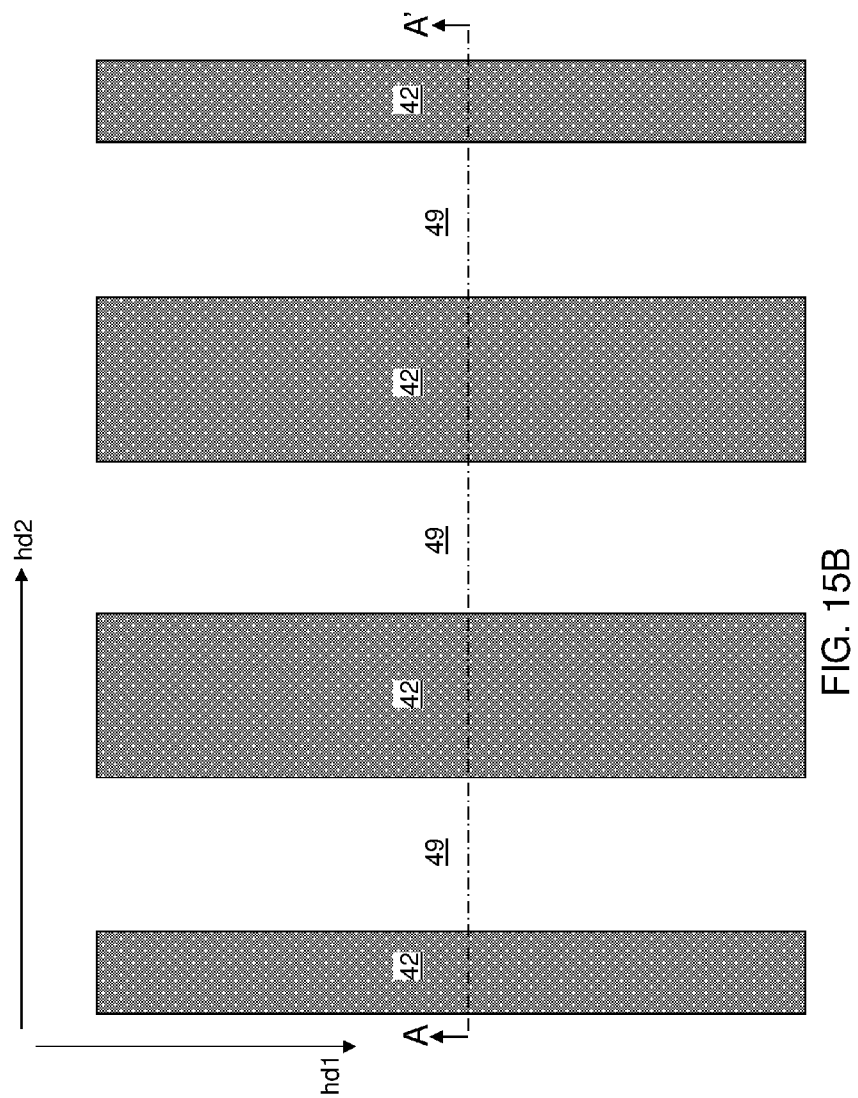

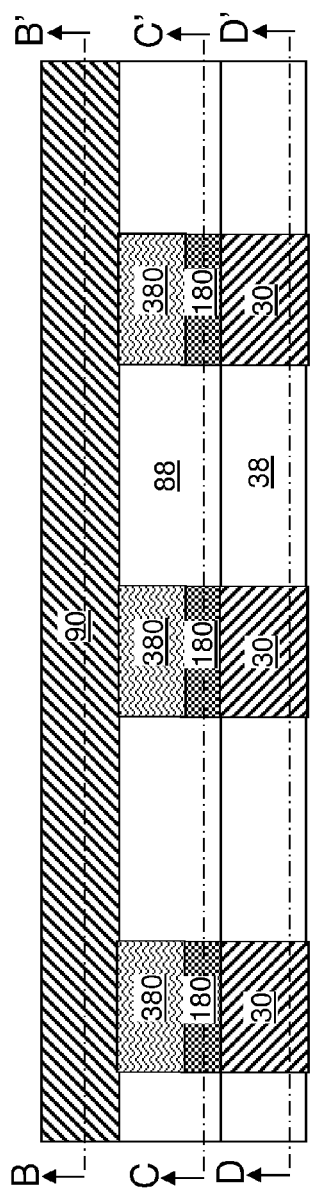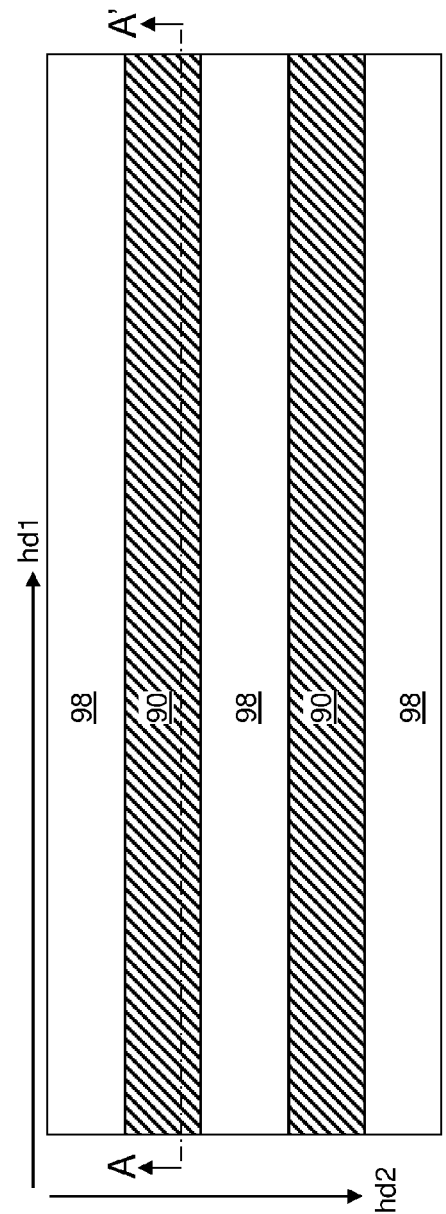
FIG. 19A
FIG. 19B

VOLATILE MEMORY DEVICE EMPLOYING A RESISTIVE MEMORY ELEMENT

FIELD

The present disclosure relates generally to the field of semiconductor devices and specifically to resistive memory devices, such as a volatile memory device employing a resistive storage element, and methods of making the same.

BACKGROUND

Previously known resistive memory devices are non-volatile memory devices employing non-volatile and reversible changes in resistance in a thin film with application of electrical voltage bias. As a "non-volatile" memory device, data stored in the resistive memory element does not change the value even when the power is turned off. In other words, the stored value of the data in any functional resistive memory device remains the same until the resistive memory element is reprogrammed, for example, in an erase operation or in a programming operation. The data stored in the non-volatile memory device can be reversed only when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a volatile resistive memory device includes a resistive memory element including a barrier material portion and a charge-modulated resistive memory material portion. The resistive memory device may be a volatile eDRAM device.

According to another aspect of the present disclosure, a method of operating a volatile resistive memory device comprises providing a resistive memory element comprising a barrier material portion and a charge-modulated resistive memory material portion, and reading a resistance state of the resistive memory element. The step of reading does not disturb the resistance state of the charge-modulated resistive memory material portion.

According to another aspect of the present disclosure, a resistive memory device includes a resistive memory element. The resistive memory element comprises a barrier material portion and a charge-modulated resistive memory material portion. The barrier material portion comprises a material selected from germanium and silicon-germanium. The charge-modulated resistive memory material portion comprises a non-filamentary, electrically conductive metal oxide.

BRIEF DESCRIPTION OF THE DRAWINGS

FIG. 11B is a horizontal cross-sectional view of the first exemplary structure of FIG. 11A along the horizontal plane B-B'. The vertical plane A-A' is the plane of the cross-section for FIG. 11A.

FIG. 11D is a horizontal cross-sectional view of the first exemplary structure of FIG. 11A along the horizontal plane D-D'. The vertical plane A-A' is the plane of the cross-section for FIG. 11A.

FIG. 12B is a horizontal cross-sectional view of the exemplary structure of FIG. 12A along the horizontal plane B-B'. The vertical plane A-A' is the plane of the cross-section for FIG. 12A.

FIG. 15B is a horizontal cross-sectional view of the second exemplary structure of FIG. 15A along the horizontal plane B-B'. The vertical plane A-A' is the plane of the cross-section for FIG. 15A.

FIG. 19A is a vertical cross-sectional view of a third exemplary structure including a resistive random access memory device that includes a rectangular grid array of resistive memory elements and optional selector elements according to an embodiment of the present disclosure.

FIG. 19B is a horizontal cross-sectional view of the third exemplary structure of FIG. 19A along the horizontal plane B-B'. The vertical plane A-A' is the plane of the cross-section for FIG. 19A.

DETAILED DESCRIPTION

Figure 1A:
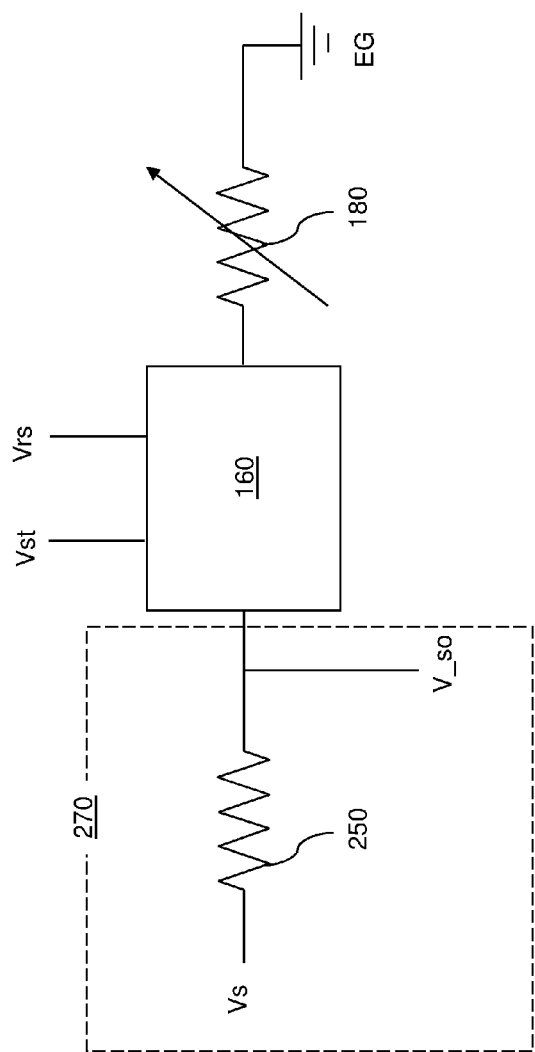
FIGS. 1A and 1B are schematic diagrams of components of a volatile memory device of the present disclosure.

As discussed above, the present disclosure is directed to a memory device, such as a volatile memory device employing a resistive storage element, and methods of making the same, the various aspects of which are described below. The embodiments of the disclosure can be employed to form various semiconductor devices including at least one volatile memory device. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "volatile memory device" refers to memory device that does not store date for over 10 minutes when external power to the device is turned off. In one embodiment, the volatile memory device uses a periodic refresh of stored data to maintain the value of the stored data the same during its operation.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. A "semiconducting material" refers to a material having electrical conductivity in a range from $1.0 \times 10^{-6}$ S/cm to $1.0 \times 10^{5}$ S/cm. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various three dimensional memory devices of the present disclosure can include a memory device, such as a volatile memory device employing a resistive memory element, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

A typical volatile memory device is a Dynamic Random Access Memory (DRAM) device, which is a volatile memory device including random data access capabilities. As is well known, DRAM devices require periodic refresh for preserving data stored in them. The refresh interval for DRAMs is on the order of tens of milliseconds. During a refresh operation on a volatile memory device, the stored information in each cell is read out and is subsequently rewritten into each cell. In the case of DRAM devices employing a capacitor as a data storage element, presence or absence of stored electrical charges in the capacitor of each cell is detected by inducing any stored electrical charge to affect the output voltage that is read through bit lines. As such, the read operation on a capacitor-based DRAM cell is a destructive operation that removes electrical charges previously stored in the capacitors of the memory cells. The DRAM may comprise embedded DRAM (eDRAM) which is integrated on the same die (e.g., same substrate) or multi-chip module as logic component, such as a microprocessor or application specific integrated circuit (ASIC). Alternatively, the DRAM may comprise a standalone chip (i.e., stand alone memory) which is separate from the chip containing the logic component.

The present disclosure provides a memory device, such as a volatile memory device employing a resistive memory element. The volatile memory device of the present disclosure differs from dynamic random access memory devices in that the memory cell does not include a capacitor. Instead, in one embodiment, the different memory levels (i.e., states) of the volatile memory device of the present disclosure are based on the different concentration of oxygen vacancies in each level (i.e., state) which lead to a different resistance of the device in each level (i.e., state). The concentration of oxygen vacancies can be detected by measuring the resistance of the resistive memory element. Unlike prior art resistive random access memory devices, the memory device of one embodiment of the present disclosure is used as a volatile memory element. As such, the resistive memory element does not retain the programmed level of oxygen vacancy concentration indefinitely. The oxygen vacancy concentration of the resistive memory element of the present disclosure drifts (i.e., changes) to a natural oxygen vacancy state as a function of time. A periodic refresh that does not destroy the stored contents of the memory cell is performed to maintain the resistance of each resistive element at its respective target state (i.e., a non-destructive read step without read disturb). Programming of the resistive memory device of one embodiment of the present disclosure is performed by applying an electrical field (i.e., bias voltage) either in a forward bias mode or in a reverse bias mode to program the state of the resistive memory device by changing the concentration of the oxygen vacancies in the device. In contrast to a prior art DRAM, each cell of the resistive memory device of one embodiment of the present disclosure may be a multi-level cell which can have two or more bits per cell (i.e., can have three or more distinct resistivity states).

Referring to FIG. 1A, a schematic diagram of components of part of a volatile memory device of the present disclosure is illustrated. The volatile memory device includes a series connection of a resistive memory element 180 (e.g., one memory cell), an optional switching element 160, and a sense circuitry 270. The resistive memory element 180 includes a barrier material portion and a charge-modulated resistive memory material portion, of which the details are described below. As used herein, a "charge-modulated resistive memory material" refers to a resistive memory material that can have at least two different states of resistivity due to different states of charge distribution, which can be due to ion or vacancy modulation. Thus, the charge-modulated resistive memory materials of the present disclosure include vacancy modulated resistive memory materials that can change the distribution (e.g., location or concentration as function of location) of vacancies therein and ionic resistive memory materials that can change the distribution (e.g., location or concentration as function of location) of ions therein. One end of the resistive memory element 180 can be connected to a voltage source, which can be electrical ground (EG) or any other predefined voltage (e.g., word line voltage). Another end of the resistive memory element 180 can be connected to an optional switching element 160.

The switching element 160 can be configured to provide alternate electrical connection between a programming mode and a sensing mode. While the volatile memory cell is in the programming mode, the switching element 160 provides a voltage selected from a reset voltage Vrs and a set voltage Vst. The reset voltage Vrs is a voltage that programs the resistive memory element into a high resistance state, which is a volatile state that changes (e.g., decays) over time into a low resistance state. The set voltage Vst is a voltage that programs the resistive memory element into a low resistance state, which is a stable state that does not change in time. The reset voltage Vrs and the set voltage Vst can have the opposite polarities. In other words, if one of the reset voltage Vrs and the set voltage Vst is positive, the other of the reset voltage Vrs and the set voltage Vst is negative. The switching element 160 can be embodied as a set of transistors (such as field effect transistors) that are connected to provide only one connection at a time to the resistive memory element 180 selected from connection to the reset voltage supply, connection to the set voltage supply, and connection to the sense circuitry 270. The reset voltage supply and the set voltage supply may comprise the same voltage source that provides opposite polarity voltages or different voltage sources. Furthermore, the sense circuitry 270 may comprise different or the same circuitry as the set and/or reset voltage supplies. Optionally, the switching element 160 can provide a fourth state in which the resistive memory element 180 is not connected to any voltage source on the side of the switching element 160.

When the volatile memory cell is in the sensing mode, the switching element 160 provides electrical connection between the resistive memory element 180 and the sense circuitry 270. The sense circuitry 270 can include a reference resistor 250 that provides a pre-determined resistance, and is connected to a voltage supply source that provides a sense circuit power supply voltage Vs. The magnitude of the sense circuit power supply voltage Vs is less than the magnitudes of the reset voltage Vrs and the set voltage Vst. The reference resistor 250 and the resistive memory element 180 forms a voltage divider circuit to provide a sense output voltage V_so, of which the value depends on the state of the resistive memory element 180.

The resistive memory element 180 can be manufactured in the low resistance (i.e., low resistivity) state and then programmed into a high resistance (i.e., resistivity) state or a low resistance (i.e., resistivity) state by applying the reset voltage Vrs or the set voltage Vst employing the switching element 160. The sense circuitry 270 is configured to measure a resistive state of the resistive memory element 180 by measurement of an electrical current therethrough under a measurement bias condition (e.g., under a read voltage) provided by the sense circuit power supply voltage Vs.

Figure 1B:
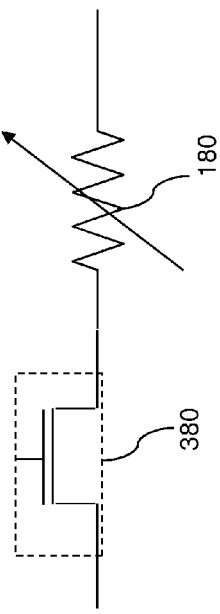

Optionally, a first node of the resistive memory element 180 can be connected to a node of an optional selector element 380, as shown in FIG. 1B. In other words, the resistive memory element 180 can be connected in series to a transistor or diode selector element 380. As used herein, a selector element is an element that displays a non-linear voltage-current characteristic such that the element functions as an electrical insulator in a first voltage range and functions as an electrical conductor in a second voltage range. In one embodiment, the selector element 380 may be a transistor, such as a field effect transistor shown in FIG. 1B. In another embodiment, the selector element 380 may be a diode, such as a semiconductor diode (e.g., a pn junction diode, a pin junction diode, or a Schottky diode) or a metal-insulator-metal (MIM) diode. An example of a selector element 380 comprising oxide material that functions as an insulator at a low electric field and functions as a conductor at a high electric field is described in Sung Hyun Jo et al., Cross-Point Resistive RAM Based on Field-Assisted Superlinear Threshold Selector, IEEE Transactions on Electron Devices, Vol. 62, No. 11, Nov. 2015.

Figure 2:
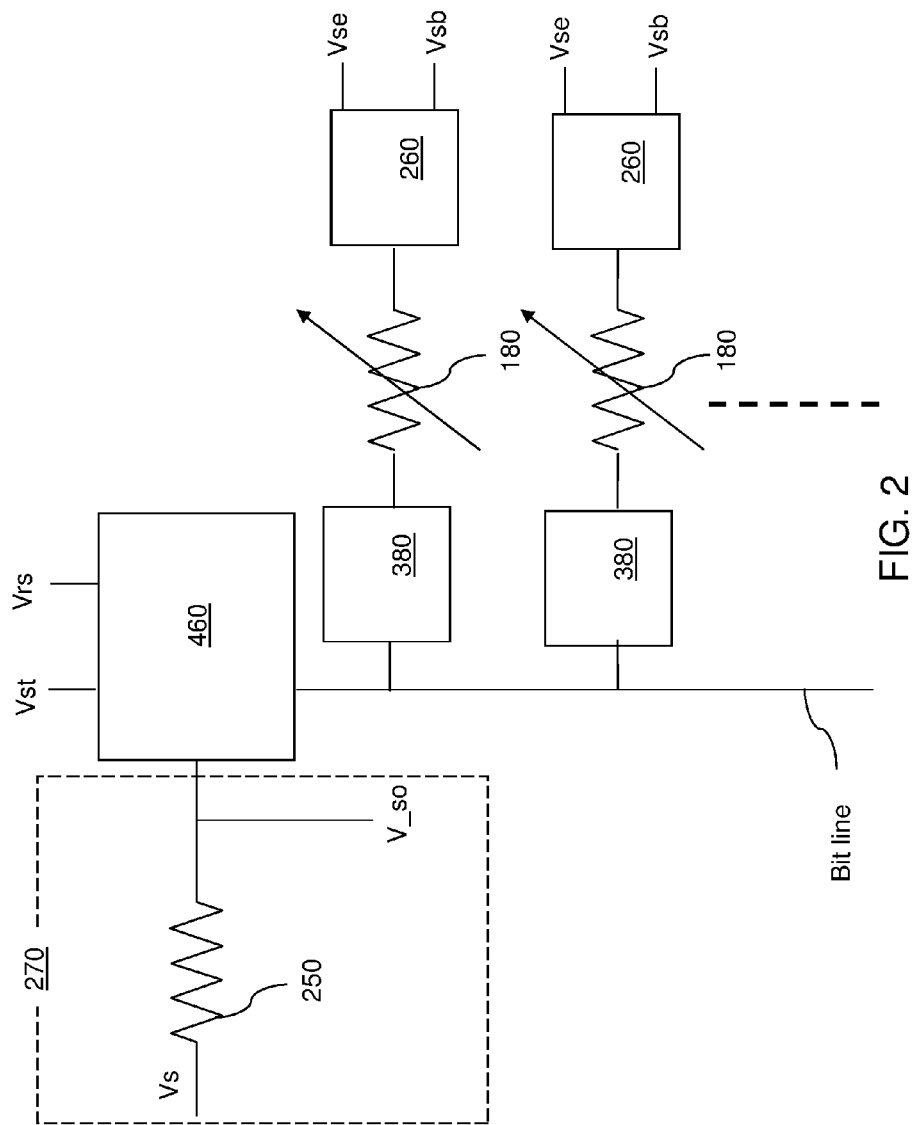
FIG. 2 is a schematic diagram of volatile memory cells of the present disclosure in an array environment.

Referring to FIG. 2, a schematic diagram of volatile memory elements (e.g., memory cells) 180 of the present disclosure in an array environment is illustrated. FIG. 2 schematically illustrates possible components of the device of one embodiment and does not necessarily represent an actual circuit diagram of a device. A plurality of resistive memory elements 180 can be arranged in a one-dimensional array, a two-dimensional array, or a three-dimensional array.

Optionally, the first node of each resistive memory element 180 can be connected to the node of the optional selector element 380, such as a diode or transistor described above. If the selector element 380 is a transistor, then the selector element 380 may be part of the switching element 160 or 460 or it may be a separate element from the switching element (160, 460). Furthermore, if the selector element 380 is a transistor, then it may function as a switching element and the separate switching element (160, 460) may be omitted.

A second node of each resistive memory element 180 can be connected to a respective word line bias voltage selector 260. Each word line bias voltage selector can be configured to select a voltage from at least two voltages such as a word line select voltage Vse and a word line standby voltage Vsb. The word line select voltage Vse applied to a selected word line bias voltage selector 260 "selects," or activates, at least one resistive memory element 180 directly connected to the selected word line bias voltage selector 260. The word line standby voltage Vsb is applied to all other word line bias voltage selectors 260 other than the selected word line bias voltage selector 270. The word line standby voltage Vsb "unselects," or deactivates, resistive memory elements 180 directly connected to the word line bias voltage selectors 260 to which the word line standby voltage Vsb is applied. In other words, the electrical connection between the resistive memory elements 180 and the bit line connected to the resistive memory elements 180 is disabled by providing an electrical open state for each resistive memory element 180 to which the word line standby voltage Vsb is applied.

In some embodiments, the values of the word line select voltage Vse and the word line standby voltage Vsb may be different depending on the operational mode of the volatile memory device. For example, the value of the word line select voltage Vse for programming a resistive memory element 180 in a forward bias mode (enabled by applying one of the reset voltage Vrs and the set voltage Vst) can be different from the value of the word line select voltage Vse for programming the resistive memory element 180 in a reverse bias mode (enabled by applying the other of the reset voltage Vrs and the set voltage Vst). Further, the value of the word line select voltage Vse during a sensing mode can be different from the values of the word line select voltage Vse that can be employed during a programming mode. Likewise, the values of the word line standby voltage Vsb can be different for each operational mode of the volatile memory device.

Depending on the nature of the volatile memory device (such as the dimensionality), word lines can be provided. Each word line is a conductive line connected to a respective word line bias voltage selector 260 and a plurality of resistive memory elements 180. While FIG. 2 illustrates only one resistive memory element 180 per word line, a plurality of resistive memory elements 180 can be connected in a parallel connection in a two-dimensional array environment or in a three-dimensional array environment such as a resistive random access memory device illustrated in FIG. 3

Referring back to FIG. 2, the node of each resistive memory element 180 that is not connected to a respective word line bias voltage selectors 260 is connected directly to, or indirectly through a respective selector element 380 to, a respective bit line. Depending on the nature of the volatile memory device (such as the dimensionality), a plurality of bit lines can be provided, each of which is coupled to a plurality of word lines through a set of resistive memory elements 180 that is connected directly to the respective bit line, or connected to the respective bit line through a respective set of selector elements 380.

One end of each bit line can be connected to a respective bit line bias voltage selector 460, which provides the same function as the voltage selector 160 of FIG. 1A. Specifically, the bit line bias voltage selector 460 is configured to provide alternate electrical connection between a programming mode and a sensing mode. While the selected volatile memory cell is in the programming mode, the bit line bias voltage selector 460 provides a voltage selected from a reset voltage Vrs and a set voltage Vst. The reset voltage Vrs is a voltage that programs the selected resistive memory element into a high resistance state, which is a volatile state that decays over time into a low resistance state. The set voltage Vst is a voltage that programs the selected resistive memory element into a low resistance state, which is a stable state that does not change in time. The reset voltage Vrs and the set voltage Vst can have the opposite polarities. In other words, if one of the reset voltage Vrs and the set voltage Vst is positive, the other of the reset voltage Vrs and the set voltage Vst is negative. The bit line bias voltage selector 460 can be embodied as a set of transistors (such as field effect transistors) that are connected to provide only one connection at a time to the bit line selected from connection to the reset voltage supply, connection to the set voltage supply, and connection to the sense circuitry 270. Optionally, the bit line bias voltage selector 460 can provide a fourth state in which the bit line is not connected to any voltage source on the side of the bit line bias voltage selector 460.

Figure 3:
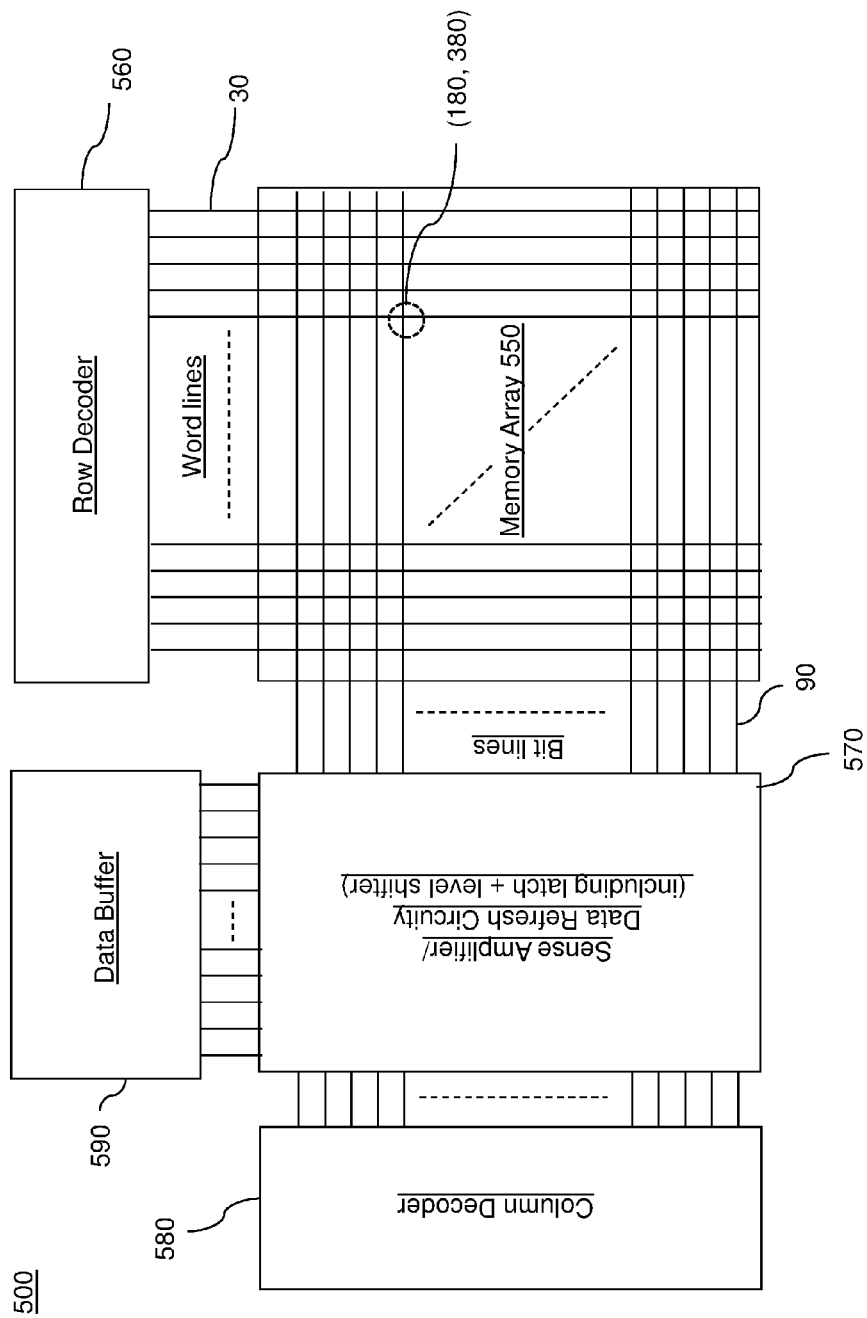
FIG. 3 is a schematic diagram of a volatile memory device including volatile memory cells of the present disclosure in an array configuration.

Referring to FIG. 3, a schematic diagram is shown for a volatile memory device including volatile memory cells of the present disclosure in an array configuration. The volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective resistive memory elements 180 and optional selector elements 380 located at the intersection of the respective word lines 30 and bit lines 90. The device 500 may also contain a row decoder 560 connected to the word lines 30, a sense amplifier and data refresh circuitry 570 connected to the bit lines 90, a column decoder 580 connected to the bit lines 90 and a data buffer 590. Multiple instances of the resistive memory element 180 are provided in an array configuration that forms the random access memory device 500. It should be noted that the location of the elements is schematic and the elements may be arranged in a different configuration (e.g., with the word line 30 rows extending left to right in this figure and the bit line 90 columns extending top to bottom in this figure).

The sense amplifier and data refresh circuitry 570 may include sense circuitry, which can include multiple instances of the sense circuitry 270 described above with respect to FIGS. 1A and 2. The sense circuitry 270 is configured to measure a resistive state of each of the resistive memory elements 180 through respective bit lines. The data refresh circuitry periodically refreshes the resistive state of each of the resistive memory elements in the array employing a sense circuitry that measures a resistive state of each of the resistive memory elements. Specifically, the data refresh circuitry is configured to periodically refresh the resistive state of each of the resistive memory elements 180, for example, by receiving the data as provided by the sense circuitry 270, and by shifting the voltage levels of the received data and applying the shifted voltages to the respective bit lines 90 while the volatile memory device operates in a programming mode. The shifted voltages can be at the voltages of the reset voltage Vrs and the set voltage Vst. The above described word line bias selectors 260 may be part of the row decoder 560 or a separate element. The above described switching element (160, 460) may be part of the column decoder 580, part of circuitry 570 or part of the data buffer 590 or it may be a separate element.

Figure 4A:
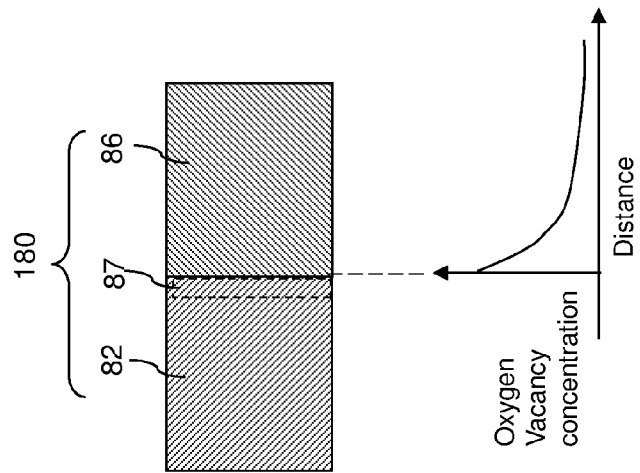
FIG. 4A illustrates the state of a resistive memory element of the present disclosure immediately after programming into a low resistance state according to an embodiment of the present disclosure.
Figure 4B:
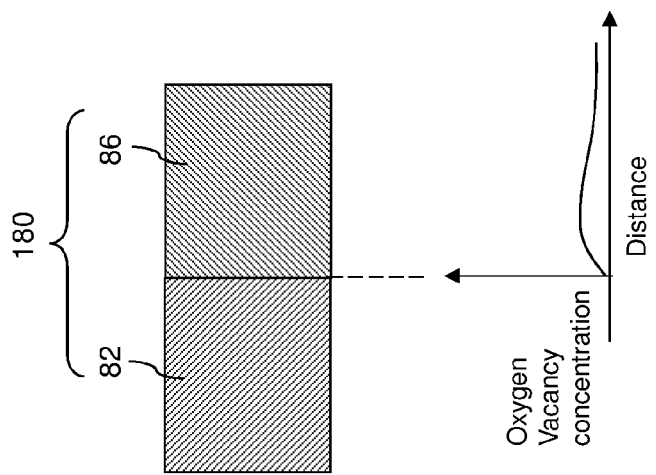
FIG. 4B illustrates the state of a resistive memory element of the present disclosure immediately after programming into a high resistance state according to an embodiment of the present disclosure.

Each resistive memory element 180 includes an optional barrier material portion 82 and a charge-modulated resistive memory material portion 86, as illustrated in FIGS. 4A and 4B. The charge-modulated resistive memory material portion 86 may be a vacancy-modulated resistive memory material portion comprising an electrically conductive metal oxide that exhibits bulk electrical conduction (i.e., conductivity) by an oxygen vacancy mechanism. Thus, portion 86 is preferably a forming free material portion which does not form conductive filaments or change its phase (e.g., from amorphous to polycrystalline) to change from a high to a low resistance state. Examples of such conductive metal oxides include a slightly sub-stoichiometric metal oxide such as $TiO_{2-x}$, $SrTiO_{3-x}$, $NbO_{2-x}$, or $Nb:SrTiO_{3-x}$ where value of x can be independently selected from a range from 0 to 1, such as greater than zero to 1 (i.e., to form a sub-stoichiometric, oxygen deficient metal oxide). For example, the charge-modulated resistive memory material portion 86 may include titanium oxide, such as sub-stoichiometric titanium oxide having less than two oxygen atoms for each titanium atom. In one embodiment, the metal oxide may have a high concentration of free electrons in thermodynamic equilibrium n0 in a range from $1.0 \times 10^{20}/cm^3$ to $1.0 \times 10^{21}/cm^3$. In one embodiment, the concentration of vacancies in portion 86 at the interface with portion 82 may increase with time without an applied external bias. The width of the charge-modulated resistive memory material portion 86 can be in a range from 10 nm to 120 nm, although lesser and greater widths can also be employed.

The barrier material portion 82 includes a barrier material that provides a suitable band gap in a range from 0.6 eV to 8 eV, such as 0.66 to 2.5 eV in order to provide a suitable level of electrical isolation between the charge-modulated resistive memory material portion 86 and a conductive material that provides electrical connection to the barrier material portion 82. For example, the barrier material portion can include a material portion that provides a suitable electronic barrier to limit current through the charge-modulated resistive memory material portion 86. In one embodiment, the barrier material portion 82 can include a material such as an amorphous semiconductor material selected from silicon, germanium, a silicon-germanium alloy, a silicon-carbon alloy, a silicon-germanium-carbon alloy, or a III-V compound semiconductor material. In one embodiment, the barrier material portion 82 includes a material selected from germanium and a silicon-germanium alloy, and the charge-modulated resistive memory material portion 86 includes titanium oxide. While the device with the germanium containing barrier material may be used in a volatile memory device, in an alternative embodiment, the device may be used in a non-volatile memory device. Alternatively, the barrier material portion 82 may comprise an electrically insulating material with an even higher band gap, such as amorphous or polycrystalline aluminum oxide having a band gap of about 7 to 7.6 eV. The width of the barrier material portion 82 can be in a range from 10 nm to 120 nm, although lesser and greater widths can also be employed. Generally, a wide band gap material requires a lesser thickness, and a narrow band gap material requires a greater thickness.

Figure 6:
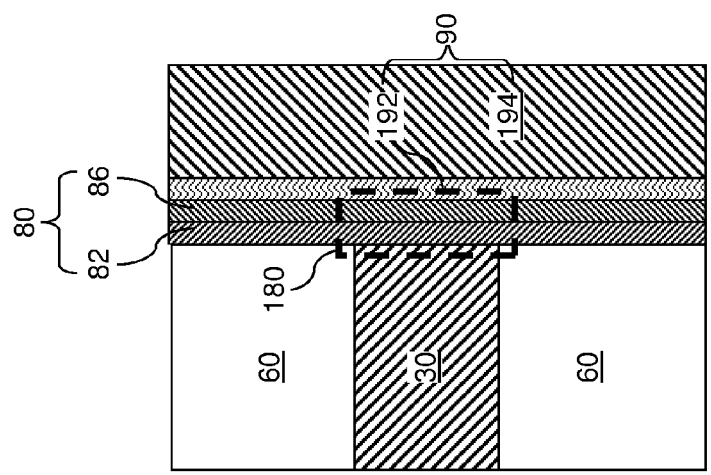
FIG. 6 is a first exemplary embodiment of the volatile memory cell of the present disclosure.
Figure 7:
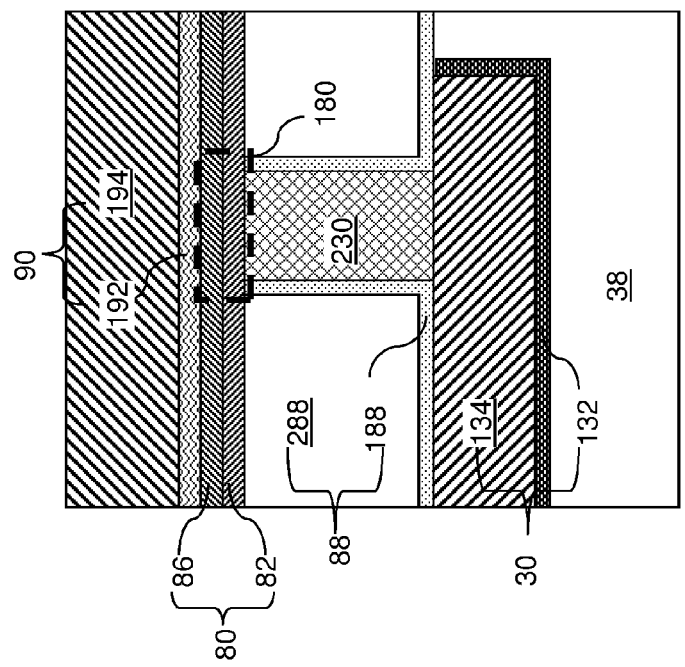
FIG. 7 is a second exemplary embodiment of the volatile memory cell of the present disclosure.

Referring to FIG. 4A, a set operation of a resistive memory element 180 during programming into a low resistance state (LRS) from the high resistance state (HRS) (i.e., to turn the element "on") is illustrated. A negative voltage is applied to the charge-modulated resistive memory material portion 86 of the resistive memory element 180 to generate an electric field along the direction from the barrier material portion 82 toward the charge-modulated resistive memory material portion 86. The voltage selector 460 can be set to a state connected to the set voltage Vst, which can be a negative voltage applied to the bit lines 90 located adjacent to the charge-modulated resistive memory material portion 86, as shown in FIGS. 6 and 7. Pairs of oxygen interstitials (i.e., interstitial oxygen ions) and oxygen vacancies are generated in the charge-modulated resistive memory material portion 86 by the applied electric field. The oxygen interstitials drift into the barrier material portion 82 where they can form a semiconductor oxide region 87 at the boundary with portion 86. The semiconductor oxide region 87 may be a germanium oxide if region 82 comprises germanium and can be silicon oxide and/or silicon-germanium oxide if region 82 comprises silicon or silicon-germanium. The charge-modulated resistive memory material portion 86 is programmed into a low resistance state in which a high concentration of oxygen vacancies near the interface with region 82 provides an electrically conductive path through the charge-modulated resistive memory material portion 86.

Referring to FIG. 4B, a reset operation of a resistive memory element 180 during programming into the high resistance state (HRS) is illustrated. A positive voltage is applied to the charge-modulated resistive memory material portion 86 of the resistive memory element 180 to generate an electric field along the direction from the charge-modulated resistive memory material portion 86 to the barrier material portion 82. The voltage selector 460 can be set to a state connected to the set voltage Vrs, which can be a positive voltage applied to the bit lines 90 located adjacent to the charge-modulated resistive memory material portion 86, as shown in FIGS. 6 and 7. The oxygen interstitials generated from inside the semiconductor oxide region 87 in the barrier material portion 82 drift into defect-rich charge-modulated resistive memory material portion 86 to recombine with oxygen vacancies within the charge-modulated resistive memory material portion 86. The recombination of the oxygen interstitials and oxygen vacancies makes the charge-modulated resistive memory material portion 86 less conductive, and the cell is switched into the high resistance state (HRS). The read operation may be carried out in the positive voltage direction.

Figure 5:
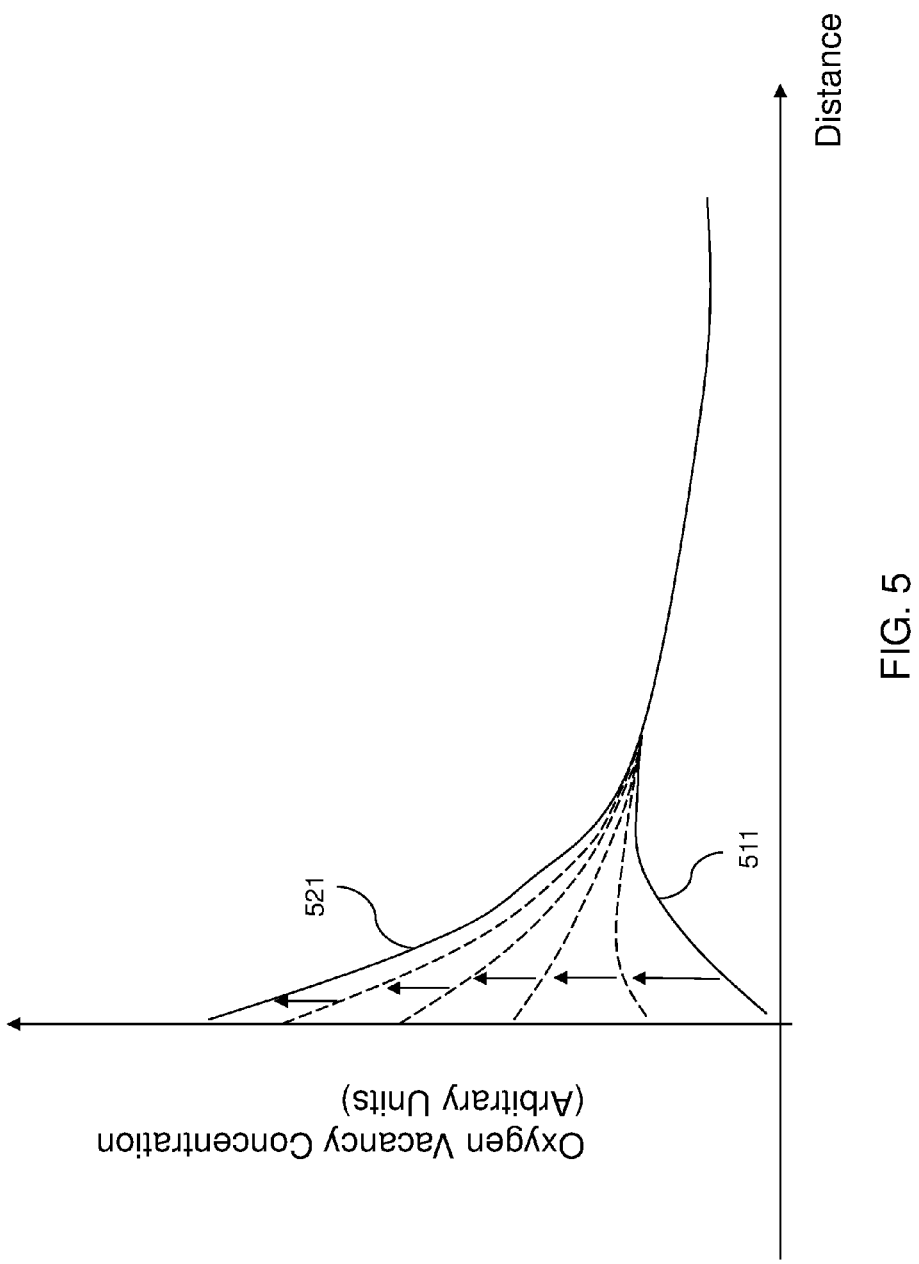
FIG. 5 is a plot of oxygen vacancy concentration as a function of distance to illustrate a change in oxygen vacancy concentration as a function of time at a particular distance within a resistive memory material portion of the present disclosure.

FIG. 5 illustrates change in oxygen vacancy concentration to an equilibrium state as a function of time within a charge-modulated resistive memory material portion 86 of the present disclosure. The curve 511 represents oxygen vacancy concentration in the charge-modulated resistive memory material portion 86 of the present disclosure immediately after programming the resistive memory element 180 into the high resistance state. The x-axis represents the distance from the interface between the barrier material portion 82 and the charge-modulated resistive memory material portion 86 into charge-modulated resistive memory material portion 86. The interface between the barrier material portion 82 and the charge-modulated resistive memory material portion 86 corresponds to the point on the x-axis that is intersected by the y-axis.

The equilibrium concentration of oxygen vacancies is given by curve 521. After programming into the high resistance state represented by the curve 511, a combination of oxygen interstitials and oxygen vacancies is gradually generated over time in the charge-modulated resistive memory material portion 86 to increase the concentration of the oxygen vacancies to the equilibrium (i.e., as-manufactured) state represented by the curve 521, which corresponds to the high resistance state. The transition (e.g., decay) from curve 511 to curve 521 may take 10 seconds to 24 hours, such as from 60 seconds to 1 hour, for example from 90 seconds to 3 minutes.

The decay of the high resistance state to the low resistance state over time renders data storage in the resistive memory elements 180 of the present disclosure "volatile," i.e., valid only for a limited period of time during. Thus, the volatile memory device of one embodiment of the present disclosure may use periodic refreshing the resistive state of each resistive memory element 180 in order to store data in the resistive memory elements 180 over time (e.g., especially to store the data in the HRS).

Referring back to FIG. 3, the data stored in the resistive memory elements 180 of the present disclosure can be refreshed employing a data refresh circuitry (e.g., by circuitry 570) by measuring a resistive state of each resistive memory element 180 and by rewriting data corresponding to the measured state of the resistive memory element into the respective resistive memory elements 180. The resistive state of each resistive memory element 180 can be measured by measurement of an electrical current therethrough under a measurement bias condition (i.e., read voltage) employing the sense circuitry 270 located in circuitry 570.

The measurement of the resistance of the resistive memory elements 180 is a non-destructive measurement process that does not disturb the resistive state of the resistive memory elements 180. Passing of electrical current through the resistive memory elements 180 under the measurement bias (i.e., read voltage) condition does not alter the concentration of oxygen vacancies in the charge-modulated resistive memory material portions 86. In other words, measuring the resistive state of the resistive memory elements 180 does not induce a change in an oxygen vacancy concentration in the charge-modulated resistive memory material portions 86. Thus, each read operation does not require a corresponding refresh operation since the read operation does not disturb the memory state of each memory cell. In other words, the read operation under the read voltage does not disturb a resistance state of the charge-modulated resistive memory material portion.

In one embodiment, the data refresh circuitry 270 can include a latch and a level shifter. In this case, measured data representing the resistive state of the resistive memory elements 180 can be temporarily stored in the latch. For example, a word line can be selected by applying the word line select voltage Vse, and the word line standby voltage Vsb can be applied to all other word lines. The bit lines can be connected to the sense circuitry 270 to simultaneously provide multiple sense output voltages V_so that represent the resistive state of the resistive memory elements 180 connected to the selected word line. Each bit line can generate a respective sense output voltage V_so. Thus, the total number of simultaneously generated sense output voltages V_so can be equal to the total number of bit lines.

The voltage levels of the stored data in the latch can be shifted to a suitable voltage level that can be employed to program the resistive memory elements 180. For example, if a high resistance state is detected for a given resistive memory element 180, the detected voltage level (which is the sense output voltage of the corresponding bit line) as stored in the latch can be shifted to the reset voltage Vrs by the level shifter. If a low resistance state is detected for a given resistive memory element 180, the detected voltage level as stored in the latch can be shifted to the set voltage Vst by the level shifter.

Generally speaking, a first voltage level of the data representing the resistive state of each resistive memory element 180 in the latch can be shifted to a second voltage level that reprograms the respective resistive memory element 180 employing the level shifter. The second voltage level can be applied to the respective resistive memory element 180 to reprogram the resistive memory element 180 into the same state as previously detected by the sense circuitry 270, thereby refreshing the resistive state of the resistive memory element 180.

In one embodiment, each resistive memory element 180 can be reprogrammed during each refreshing of the resistive state of the resistive memory element 180 by applying a programming pulse having a voltage selected from a first voltage (such as Vrs) and a second voltage (such as Vst). The first voltage can be a reset voltage that causes a first type of ionic or vacancy motion so as to increase the resistance of the resistive memory element at a read voltage. For example, the first voltage depletes oxygen vacancies from an interface between the charge-modulated resistive memory material portion 86 and the barrier material portion 82. The second voltage can be a set voltage that causes a second type of ionic or vacancy motion so as to decrease the resistance of the resistive memory element at the read voltage. For example, the second voltage creates oxygen vacancies in the charge-modulated resistive memory material portion 86.

The resistive memory elements 180 of the present disclosure can be embodied in any configuration that allows individual access to each of the resistive memory elements 180.

Referring to FIG. 6, the resistive memory elements 180 of the present disclosure can be embodied as a cross-point array that is accessed by selecting a first electrically conductive line among a plurality of first electrically conductive lines 30 embedded in a first dielectric material layer 38, and by selecting a second electrically conductive line 90 among a plurality of second electrically conductive lines 90 embedded in a second dielectric material layer. The first dielectric material layer 38 and the second dielectric material layer are spaced from each other by a combination of a dielectric matrix layer 88 and a resistive memory layer stack 80. A two-dimensional array of conductive via structures 230 can be embedded within the dielectric matrix layer 88 at cross points at which the first electrically conductive lines 30 (e.g., word lines) intersect the second electrically conductive lines 90 (e.g., bit lines).

The first electrically conductive lines 30 can extend along a first horizontal direction, thereby forming a one-dimensional array of parallel electrically conductive lines that extend along the first horizontal direction. The first electrically conductive lines 30 can include any conductive material known in the art, such as tungsten, copper, aluminum, a conductive metal nitride, or a combination thereof. For example, each first electrically conductive line 30 can include a conductive metallic liner 132 including a conductive metallic nitride (such as TiN) and a conductive fill material portion 134 including a metal (such as W).

The second electrically conductive lines 90 can extend along a second horizontal direction that is different from the first horizontal direction. The second electrically conductive lines 90 can form a one-dimensional array of parallel electrically conductive lines that extend along the second horizontal direction. The second electrically conductive lines 90 can include any conductive material known in the art, such as tungsten, copper, aluminum, a conductive metal nitride, or a combination thereof. For example, each second electrically conductive line 90 can include a conductive metallic liner 192 including a conductive metallic nitride (such as TiN) and a conductive fill material portion 194 including a metal (such as W).

The dielectric matrix layer 88 includes at least one dielectric material. The dielectric matrix layer 88 can include an interlayer dielectric (ILD) layer 288, and optionally, a dielectric liner 188. The interlayer dielectric layer 288 includes a dielectric material such as silicon oxide or organosilicate glass. The dielectric liner 188 includes a dielectric material such as silicon nitride and/or a dielectric metal oxide.

The two-dimensional array of conductive via structures 230 can be formed by depositing a conductive material (such as W, Cu, Al, a heavily doped semiconductor material, a metal-semiconductor alloy, or combinations thereof) and patterning the conductive material into a periodic array of pillar structures. Subsequently, the optional dielectric liner 188 and the interlayer dielectric layer 288 can be deposited over the two-dimensional array of conductive via structures 230 and planarized to provide a planar surface. Alternatively, the device shown in FIG. 6 may be fabricated upside down. In this case, the second electrically conductive lines 90 and the second dielectric material layer can be formed first, and the resistive memory layer stack 80 can be formed subsequently. The interlayer dielectric layer 288 can be formed on the surface of the resistive memory layer stack 80, and can be patterned to form a two-dimensional array of via cavities therethrough. After optional deposition and an anisotropic etch of the dielectric liner 188 (of which only vertical portions remain after the anisotropic etch), the two-dimensional array of conductive via structures 230 can be formed in the two-dimensional array of via cavities.

The resistive memory layer stack 80 includes a vertical stack of a barrier material portion 82 as embodied as a planar layer and a charge-modulated resistive memory material portions 86 as embodied as another planar layer. Each region of the resistive memory layer stack 80 that overlies or underlies a conductive via structure 230 constitutes a resistive memory element 180. The lateral spacing between each neighboring pair of conductive via structures 230 is selected such that each resistive memory element 180 is sufficiently electrically insulated from neighboring resistive memory element 180 by inherent resistivity of the materials of the resistive memory layer stack 80. In one embodiment, the ratio of the lateral spacing between a neighboring pair of resistive memory elements 180 to the total thickness of the resistive memory layer stack 80 can be in a range from 4 to 100, such as from 6 to 50.

Referring to FIG. 7, the resistive memory elements 180 of the present disclosure can be embodied as a three-dimensional array that is accessed by selecting a word line among a plurality of word lines 30 spaced from one another by insulating layers 60, and by selecting a vertical bit line among a plurality of vertical bit lines 90. The word lines 30 and the insulating layers 60 can be formed as an alternating stack of material layers that is patterned to provide vertically coincident sidewalls. A resistive memory layer stack 80 can be formed on the sidewalls of the alternating stack (30, 60) by deposition of material layers.

The resistive memory layer stack 80 includes a lateral stack of a barrier material portion 82 as embodied as a planar layer and a charge-modulated resistive memory material portions 86 as embodied as another planar layer. Each region of the resistive memory layer stack 80 that is located at a level of the word lines 30 constitutes a resistive memory element 180. The thickness of the insulating layers 60 is selected such that each resistive memory element 180 is sufficiently electrically insulated from neighboring resistive memory element 180 by inherent resistivity of the materials of the resistive memory layer stack 80. In one embodiment, the ratio of the thickness of the insulating layers 60 to the total thickness of the resistive memory layer stack 80 can be in a range from 4 to 100, such as from 6 to 50.

Each of the word lines 30 and the vertical bit lines 90 includes at least one conductive material. For example, each vertical bit line 90 can include a conductive metallic liner 192 including a conductive metallic nitride (such as TiN) and a conductive fill material portion 194 including a conductive metal (such as W).

The exemplary structures of FIGS. 6 and 7 are merely illustrative. Variations of the exemplary structures of FIGS. 6 and 7 can be employed, in which orientations of the various elements and/or the exemplary structures are rotated at an arbitrary angle. Further, the various elements of the exemplary structures can be modified provided that an array of resistive memory elements 80 accessible by selection of conductive lines is present in such modifications.

Figure 8:
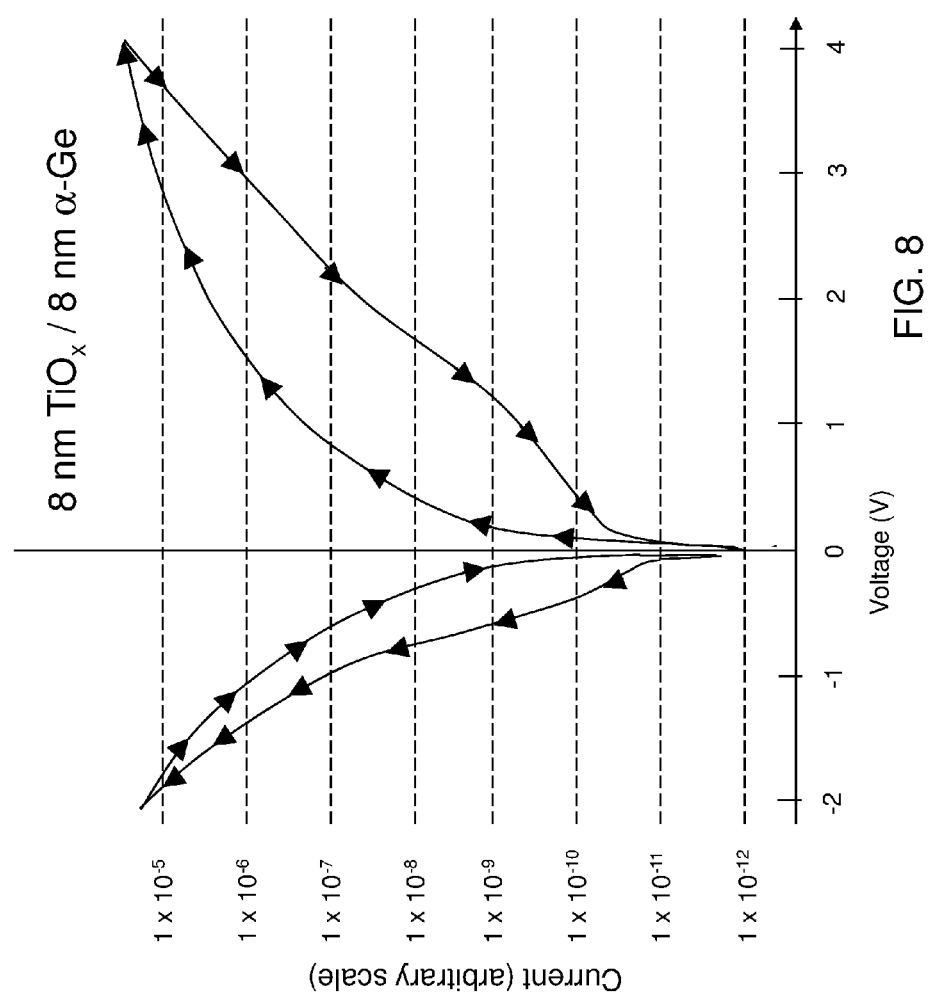
FIG. 8 is a current-voltage (IV) curve of a first exemplary volatile memory cell of the present disclosure.
Figure 9:
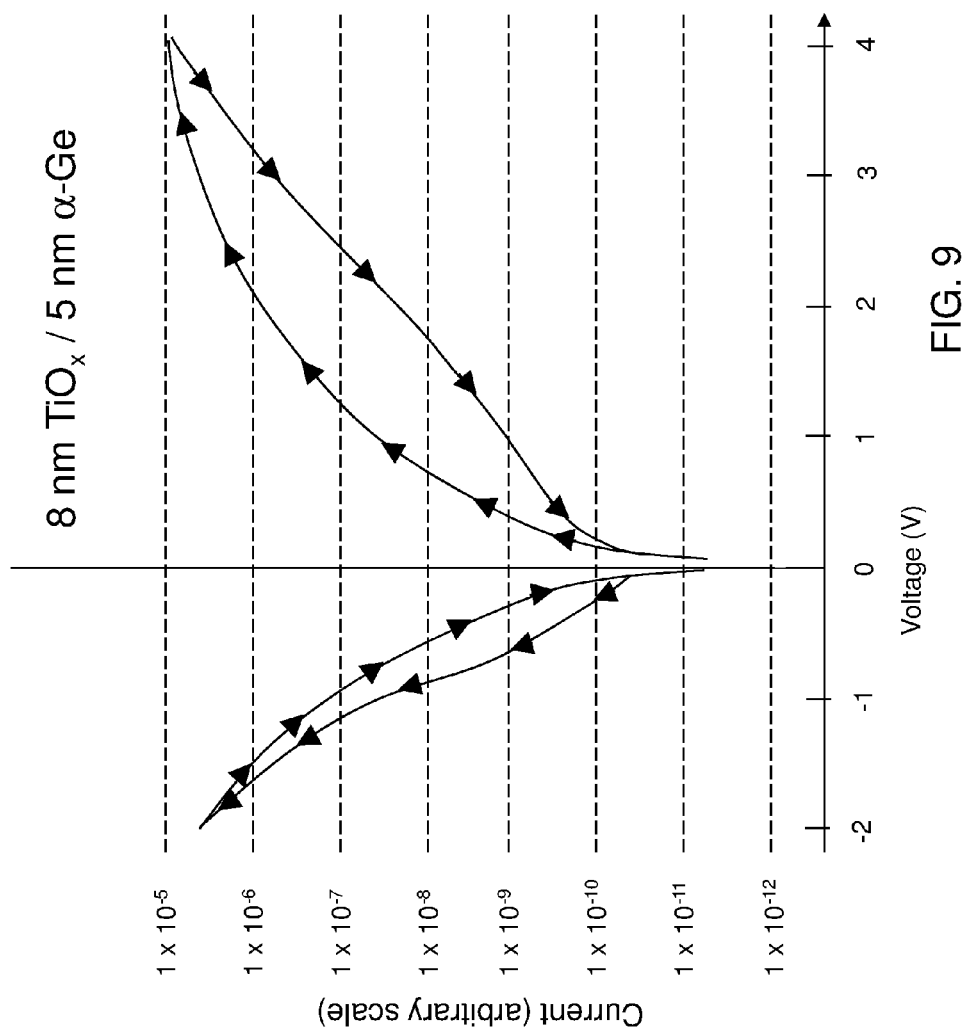
FIG. 9 is a current-voltage curve of a second exemplary volatile memory cell of the present disclosure.

According to another aspect of the present disclosure, the barrier material portion 82 can include amorphous germanium to provide superior performance compared to amorphous silicon. FIGS. 8 and 9 illustrate current-voltage (IV) curves of exemplary volatile memory cells of the present disclosure. FIG. 8 illustrates the current-voltage curve of a first exemplary volatile memory cell in which 8 nm thick amorphous germanium is employed as the barrier material portion 82, and 8 nm thick titanium oxide portion is employed as the charge-modulated resistive memory material portion 86. FIG. 9 illustrates the current-voltage curve of a second exemplary volatile memory cell in which 5 nm thick amorphous germanium is employed as the barrier material portion 82, and 8 nm thick titanium dioxide portion is employed as the charge-modulated resistive memory material portion 86.

During cycling between 4 V and −2 V for the voltage applied to the charge-modulated resistive memory material portion 86 relative to the barrier material portion 82, the current-voltage curves of the first and second exemplary volatile memory cells display hysteresis in the non-linear resistivity of the resistive memory elements 180. A positive voltage of about 4 V (as applied to the charge-modulated resistive memory material portion 86 with respect to the barrier material portion 82) as a reset voltage Vrs is sufficient to program the resistive memory element 180 into a high resistance state. A negative voltage of about −2 V (as applied to the charge-modulated resistive memory material portion 86 with respect to the barrier material portion 82) as a set voltage Vst is sufficient to program the resistive memory element 180 into a low resistance state. Difference in resistivity greater than one order of magnitude is displayed between −1 V and 3 V. A non-zero sense circuit power supply voltage Vs in a range from −1 V to 1.5 V (such as from −0.5 V to −0.1 V or from 0.1 V to 1.0 V) can be employed to perform a sense operation without affecting the resistive state of the resistive memory element of the exemplary volatile memory cells of the present disclosure.

Generally speaking, the programming voltage and the sensing voltage can be scaled, albeit non-linearly, with the thickness of the barrier material portion 82, and with the thickness of the charge-modulated resistive memory material portion 86. For the purpose of sensing, the measurement bias condition (i.e., read voltage) can include a measurement bias voltage across the resistive memory element from 0.1 to 2.0 V. The first programming voltage (e.g., the reset voltage) can be in a range from 2.0 V to 10 V, and the second programming voltage (e.g., set voltage) is in a range from −5 V to −1.0 V. In one embodiment, the programming pulse has a duration in a range from 0.1 nanosecond to 100 nanoseconds.

Figure 10:
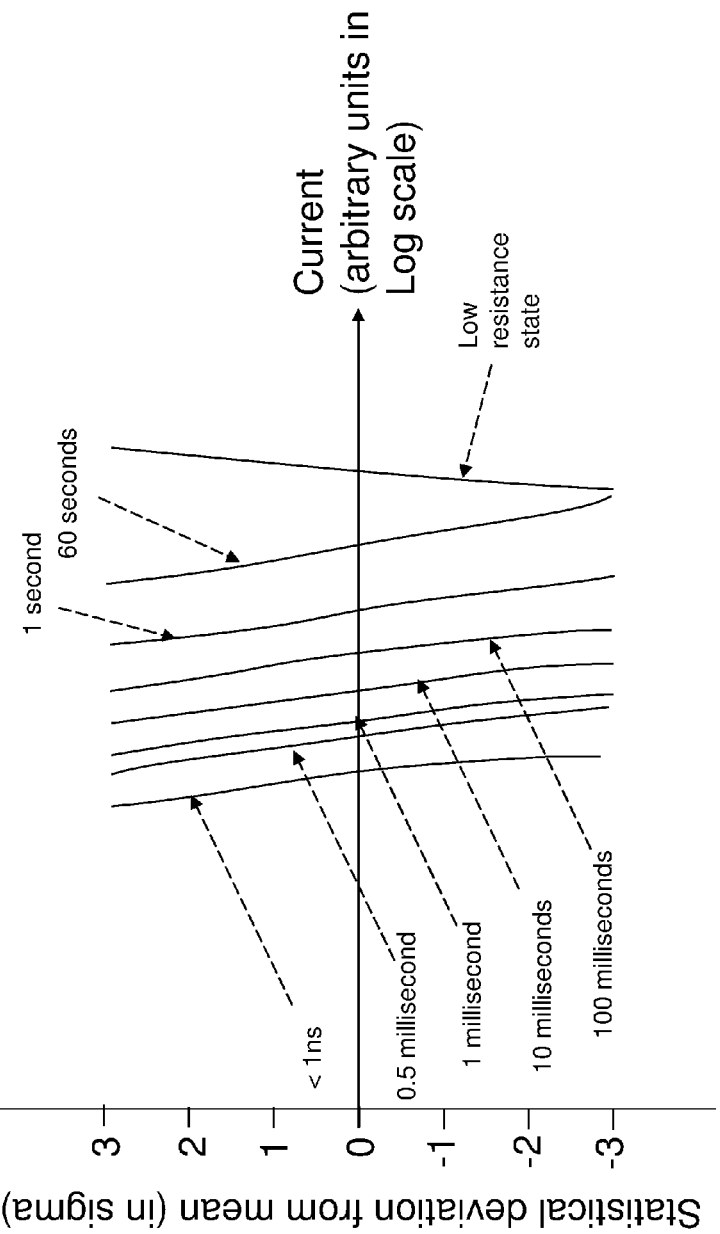
FIG. 10 is a graph illustrating the statistical distribution of measured current as a function of time after a resistive memory element of the present disclosure is programmed into a high resistance state due to a change in oxygen vacancy concentration in a resistive memory material portion.

FIG. 10 is a graph illustrating the statistical distribution of current as a function of time after a resistive memory element of the present disclosure is programmed into a high resistance state. The rightmost curve corresponds to the equilibrium state, which is the low resistance state obtained by populating the charge-modulated resistive memory material portion 86 with oxygen vacancies or by waiting indefinitely, or in practical terms, by waiting for a time period on the order of 24 hours or more. The leftmost curve shows the distribution of resistance immediately (with less than 1 ns delay) after programming the resistive memory elements 180 of the present disclosure into a high resistance state (i.e., after the reset programming step). The intermediate lines correspond to the distribution of resistance of the resistive memory elements 180 of the present disclosure after the time intervals after programming into the high resistance state indicated in the labels for the curves. As can be seen in FIG. 10, the current in the high resistance state increases as a function of time after the reset programming step. After 60 seconds, the negative three sigma (three standard deviation) of the current approaches that of the low resistance state.

According to an aspect of the present disclosure, the data refresh rate is greater than the inverse of the maximum time duration that the resistive memory elements 180 of the present disclosure can main data with reliability. In one embodiment, the data refresh circuitry illustrated in FIG. 3 can periodically refresh the resistive state of the resistive memory elements 180 at a rate of in a range from 1000 times per second to 1 time per minute, such as 100 times per second to 1 time per second to ensure integrity of stored data against continual decay of the high resistance state to the low resistance state.

In addition to the exemplary structures illustrated in FIGS. 6 and 7, the resistive memory elements 180 of the present disclosure can be implemented in various additional embodiments.

Referring to FIGS. 11A-11D, a first exemplary structure for forming a resistive random access memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 12 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

Subsequently, an alternating stack of spacer material layers and insulating layers 60 can be formed over the one dimensional array of the dielectric rail structures 42 and the composite rail structures (14B, 14C, 14T, 27). An insulating cap layer 62 can be formed over the alternating stack. In one embodiment, the spacer material layers can be word lines 30 that remain in a final device structure. In another embodiment, the spacer material layers can be sacrificial material layers that are subsequently replaced electrically conductive layers, as will be described in more detail below. In one embodiment, the insulating cap layer 62 can include a dielectric material that is different from the dielectric material of the insulating layers 60. For example, the insulating layers 60 can include undoped silicate glass (e.g., silicon oxide) or doped silicate glass, and the insulating cap layer 62 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the insulating cap layer 62 and the alternating stack of the word lines 30 and the insulating layers 60 can be patterned to form line trenches 49 that extend along the first horizontal direction hd1. Each line trench 49 can overlie the area of a respective composite rail structure (14B, 14C, 14T, 27). Each contiguous set of remaining portions of the word lines 30 and the insulating layers 60 between a pair of line trenches 49 constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned word line 30 can constitute a word line of a resistive random access memory device. In one embodiment, each alternating stack (30, 60) can have a lesser width along the second horizontal direction hd2 than the underlying dielectric rail structure 42, and can be entirety within the area of the underlying dielectric rail structure 42.

In one embodiment, the word lines 30 comprise a first electrically conductive material. In one embodiment, the first electrically conductive material can include an elemental metal, an intermetallic alloy, and/or a conductive metal nitride.

The thickness of the word lines 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap layer 62 can be in a range from 5 nm to 300 nm, although lesser and greater thicknesses can also be employed.

A pair of a word line 30 and an insulating layer 60 can constitute a unit of repetition in the alternating stack (30, 60) of die word lines 30 and the insulating layers 60. The total number of repetitions can be in a range from 8 to 1,024, although lesser and greater number of repetitions can also be employed. Thus, a plurality of alternating stacks (30, 60) of insulating layers 60 and word lines 30 is formed over a substrate 6. Each of the insulating layers 60 and the word lines 30 extends along the first horizontal direction (i.e., the word line direction) hd1. The alternating stacks (30, 60) are laterally spaced from one another along the second horizontal direction hd2 (i.e., the global bit line direction).

Figure 12A:
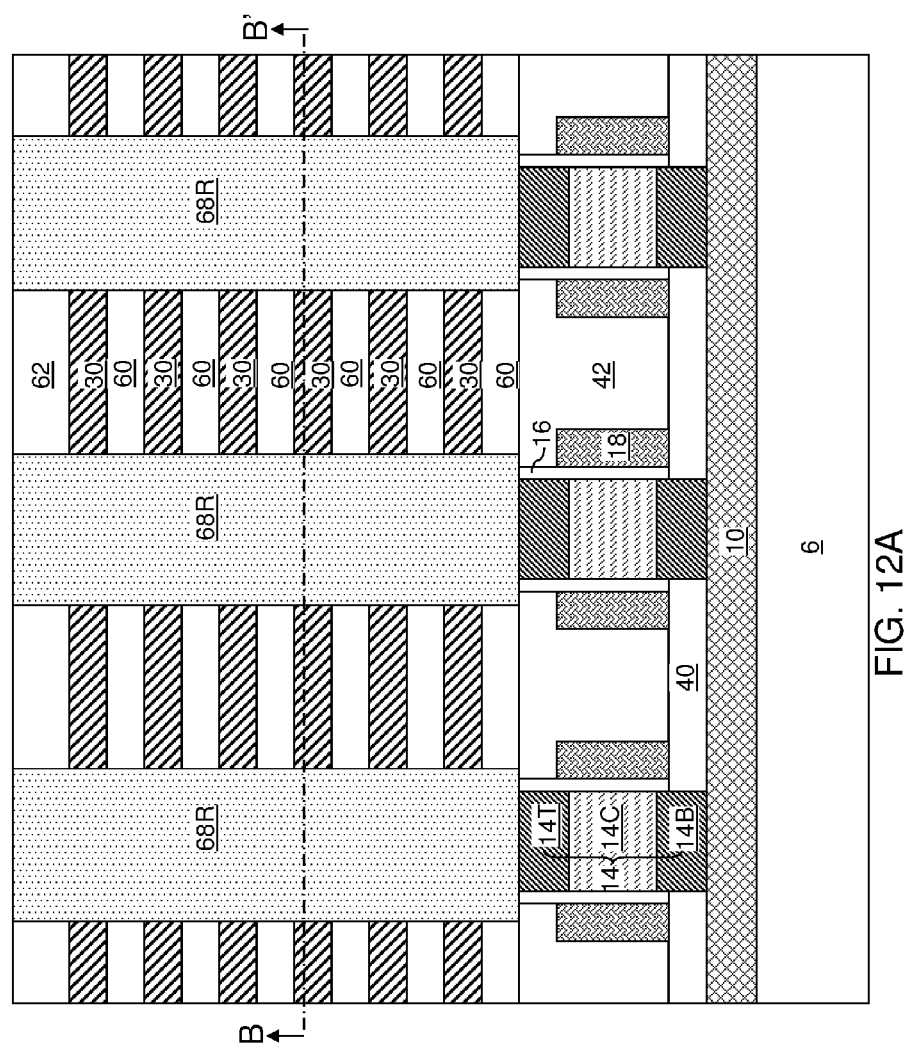
FIG. 12A is a vertical cross-sectional view of the first exemplary structure after formation of dielectric trench fill structures according to an embodiment of the present disclosure.

Referring to FIGS. 12A and 12B, a dielectric material s deposited to fill the line trenches 49. The dielectric material can be removed from above a horizontal plane including the top surfaces of the insulating cap layers 62. Each remaining portion of the dielectric material filling a line trench 49 constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass (e.g., $SiO_2$) or doped silicate glass, the insulating cap layers 62 can include silicon nitride or a dielectric metal oxide, and the separator rail structures 68R can include doped silicate glass, undoped silicate glass, or organosilicate glass.

Figure 13A:
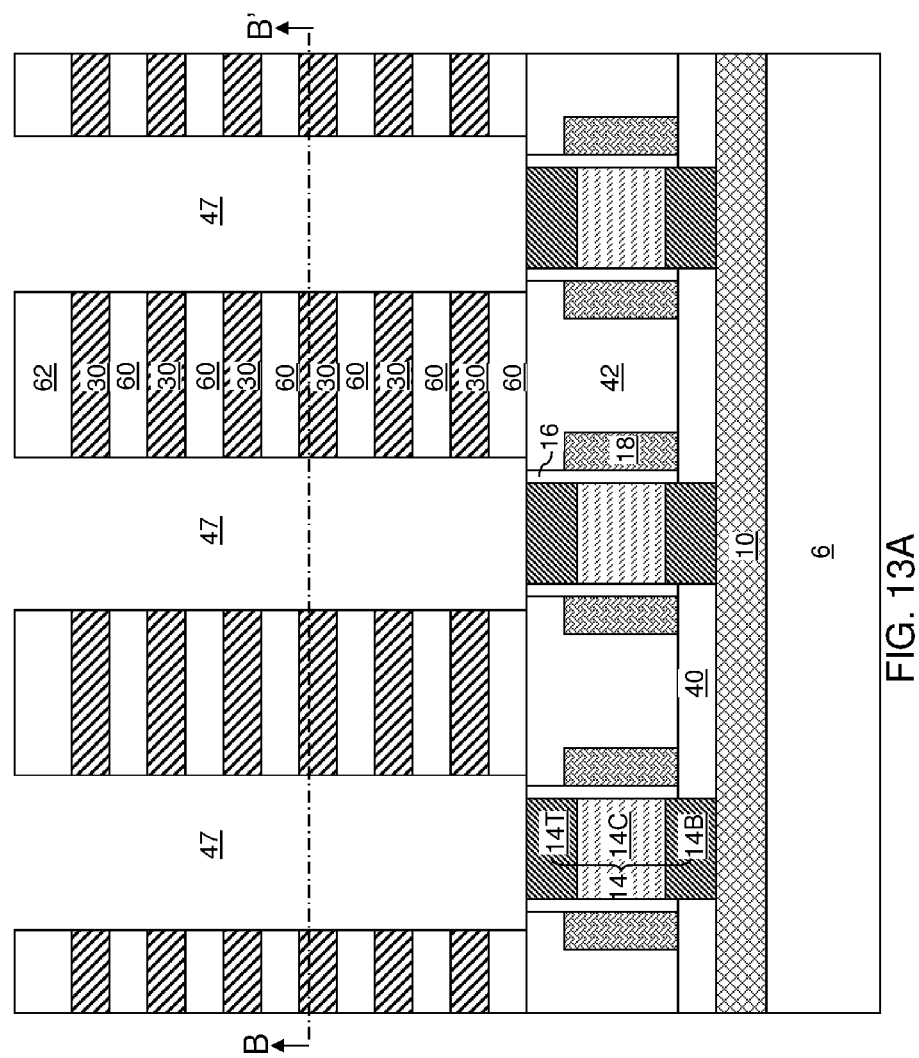
FIG. 13A is a vertical cross-sectional view of the first exemplary structure after formation of dielectric pillar structures and bit line openings according to an embodiment of the present disclosure.
Figure 13B:
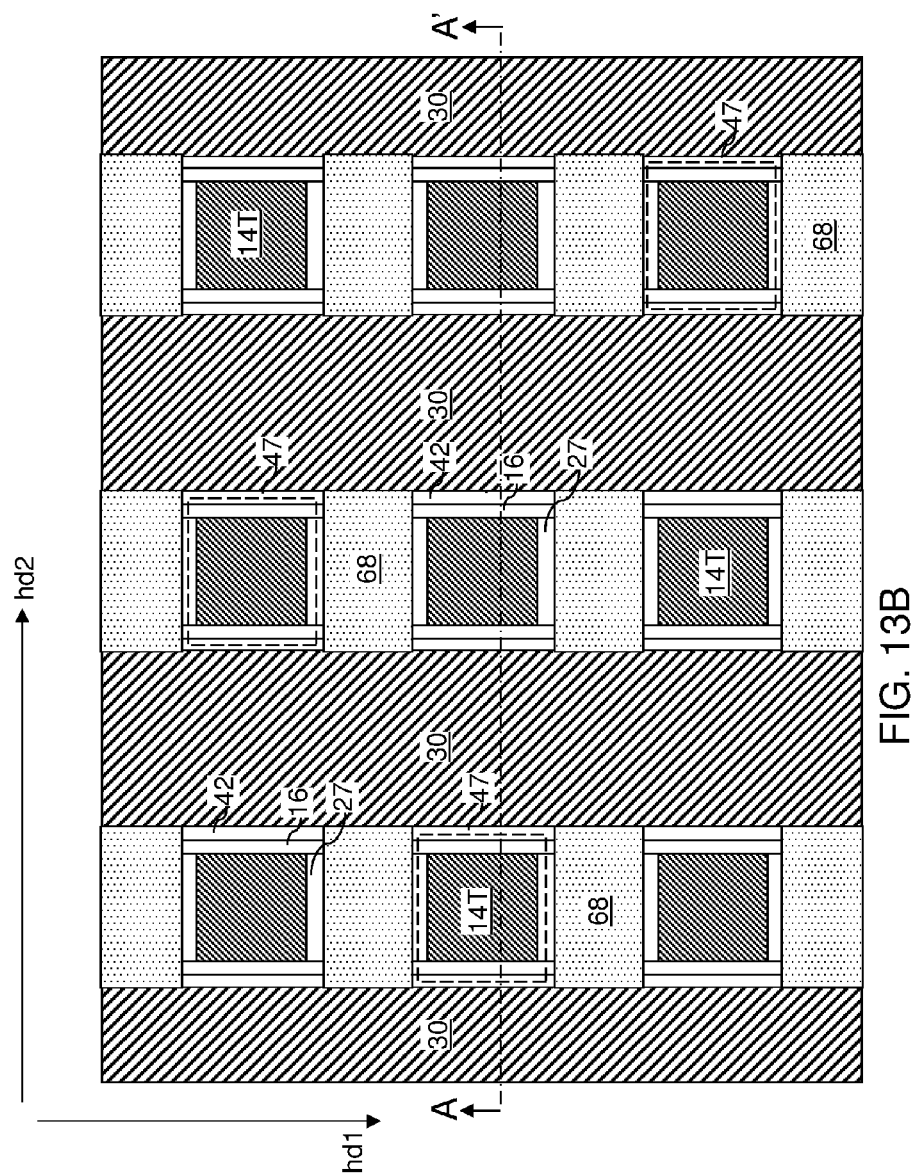
FIG. 13B is a horizontal cross-sectional view of the exemplary structure of FIG. 13A along the horizontal plane B-B'. The vertical plane A-A' is the plane of the cross-section for FIG. 13A.

Referring to FIGS. 13A and 13B, bit line cavities 47 can be formed by patterning the separator rail structures 68R into separator pillar structures 68. Specifically, a photoresist layer (not shown) can be applied over the insulating cap layers 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layers 62 can be performed to remove portions of the separator rail structures 68R that are not covered by a combination of the photoresist layer portions and insulating cap layers 62. Bit line cavities 47 having rectangular horizontal cross-sectional areas and extending through the alternating stacks (30, 60) to top surfaces of the top active regions 14T can be formed, thereby separating the separator structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 14A:
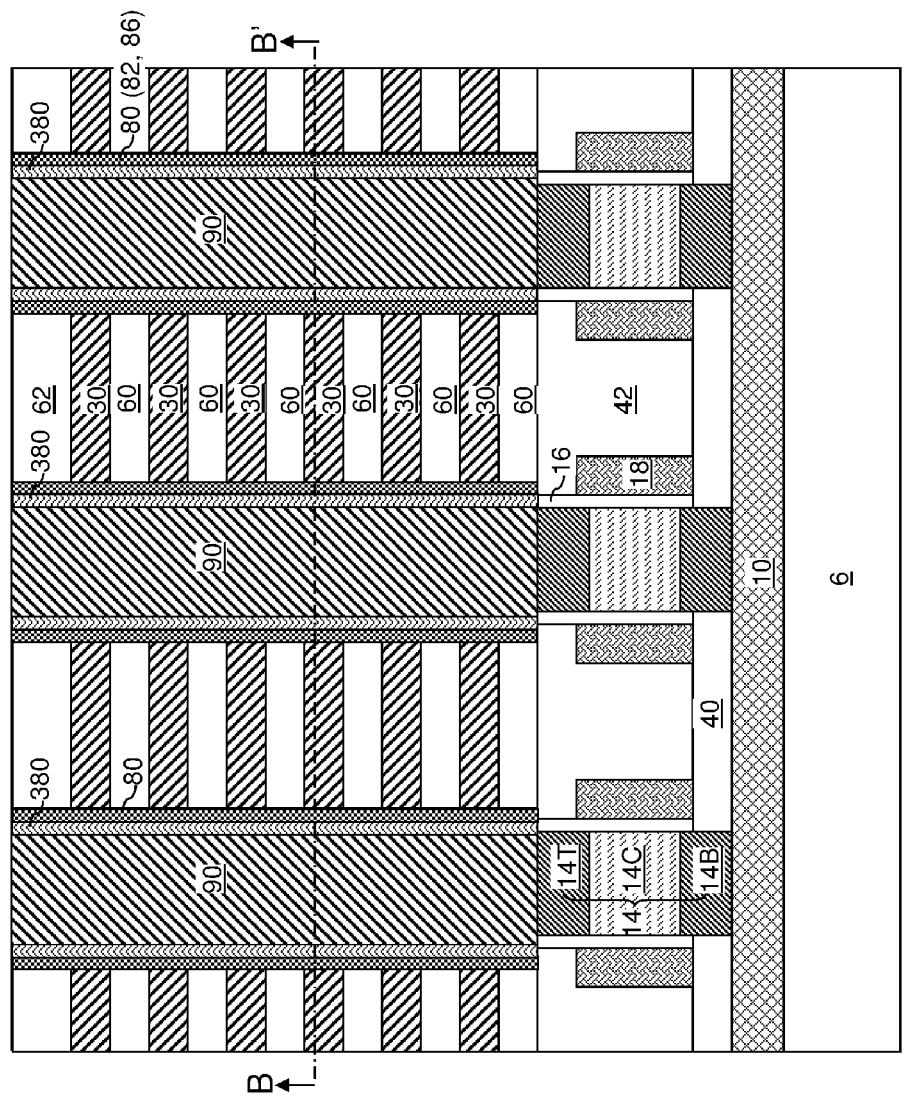
FIG. 14A is a vertical cross-sectional view of the first exemplary structure after formation of resistive memory layers and bit line structures according to an embodiment of the present disclosure.
Figure 14B:
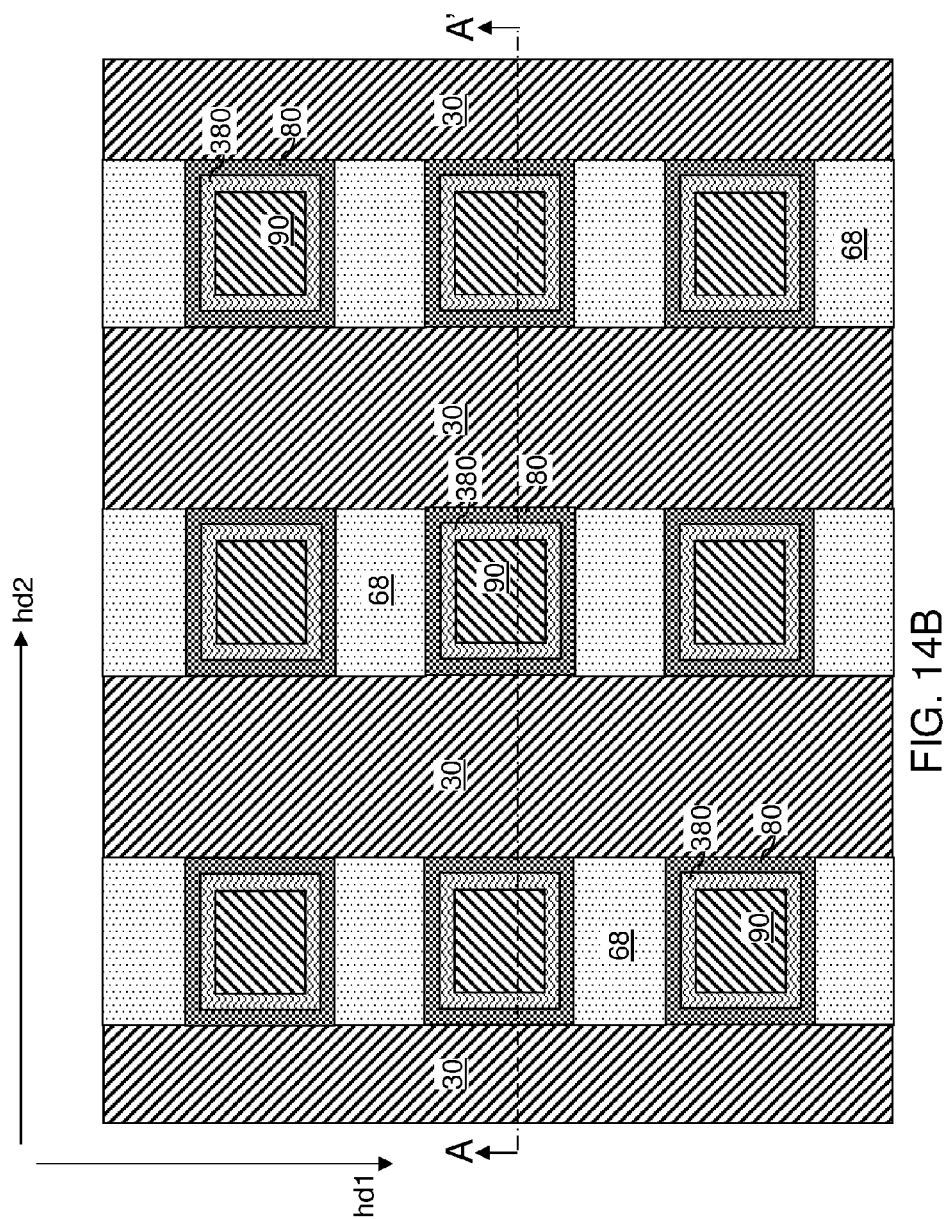
FIG. 14B is a horizontal cross-sectional view of the exemplary structure of FIG. 14A along the horizontal plane B-B'. The vertical plane A-A' is the plane of the cross-section for FIG. 14A.

Referring to FIGS. 14A and 14B, a resistive memory layer stack 80 and a selector element (i.e., a steering element) 380 can be formed on each sidewall of the bit line cavities 47. For example, a continuous resistive memory material layer and a continuous selector element layer can be deposited as continuous layers, and can be anisotropically etched to remove horizontal portions thereof. Each remaining vertical portion of the continuous resistive memory material layer constitutes a resistive memory layer stack 80, and each remaining vertical portion of the continuous selector element layer constitutes a selector element 380. The resistive memory layer stack 80 includes a lateral stack of a barrier material portion 82 as embodied as a planar layer and a charge-modulated resistive memory material portions 86 as embodied as another planar layer as described above. Each resistive memory layer stack 80 can be topologically homeomorphic to a torus, and each selector element 380 can be topologically homeomorphic to a torus. As used herein, an element is "topologically homeomorphic to a torus" if the element has a geometrical shape that can be continuously stretched to match a torus without creating or destroying a new hole.

The selector element 380 is optional. Thus, depending on the configuration of specific resistive random access memory, the selector element 380 may, or may not, be present. Generally speaking, selector elements known in the art can be optionally employed in conjunction with the resistive memory layer stacks 80 of the present disclosure.

The selector elements 380, if employed, can include at least one semiconductor element that provides a non-linear current-voltage characteristic. For example, the selector element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p− or p region) including p-type dopants at an atomic concentration less than $5.0 \times 10^{19}/cm^3$. In one embodiment, the n-doped semiconductor regions can be embodied as discrete n-doped barrier material portions. In another embodiment, the n-doped semiconductor regions can be embodied as portions of a continuous n-doped semiconductor material layer. In one embodiment, each n-doped semiconductor region can be incorporated as a portion of a second electrode.

While the present disclosure is described employing an embodiment in which the materials of the resistive memory layer stacks 80 are deposited first, and the materials of the selector elements 380 are subsequently deposited, embodiments are expressly contemplated herein in which the order of deposition of the materials is reversed. In this case, outer sidewalls of the selector elements 380 can contact sidewalls of the alternating stacks (30, 60) and sidewalk of the separator pillar structures 68, and inner sidewalk of the selector elements 380 can contact outer sidewalls of the resistive memory layer stacks 80.

At least one conductive material is deposited in each remaining volume of the bit line cavities 47 to form vertical bit lines 90 (e.g., local bit lines). The at least conductive material can include an elemental metal (e.g., W, Ti, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layers 62, for example, by a planarization process (such as chemical mechanical planarization and/or a recess etch).

The word lines 30 and the global bit lines 10, and optionally, the vertical bit lines 90 can be suitably electrically wired for operation as a resistive random access memory device.

Figure 11A:
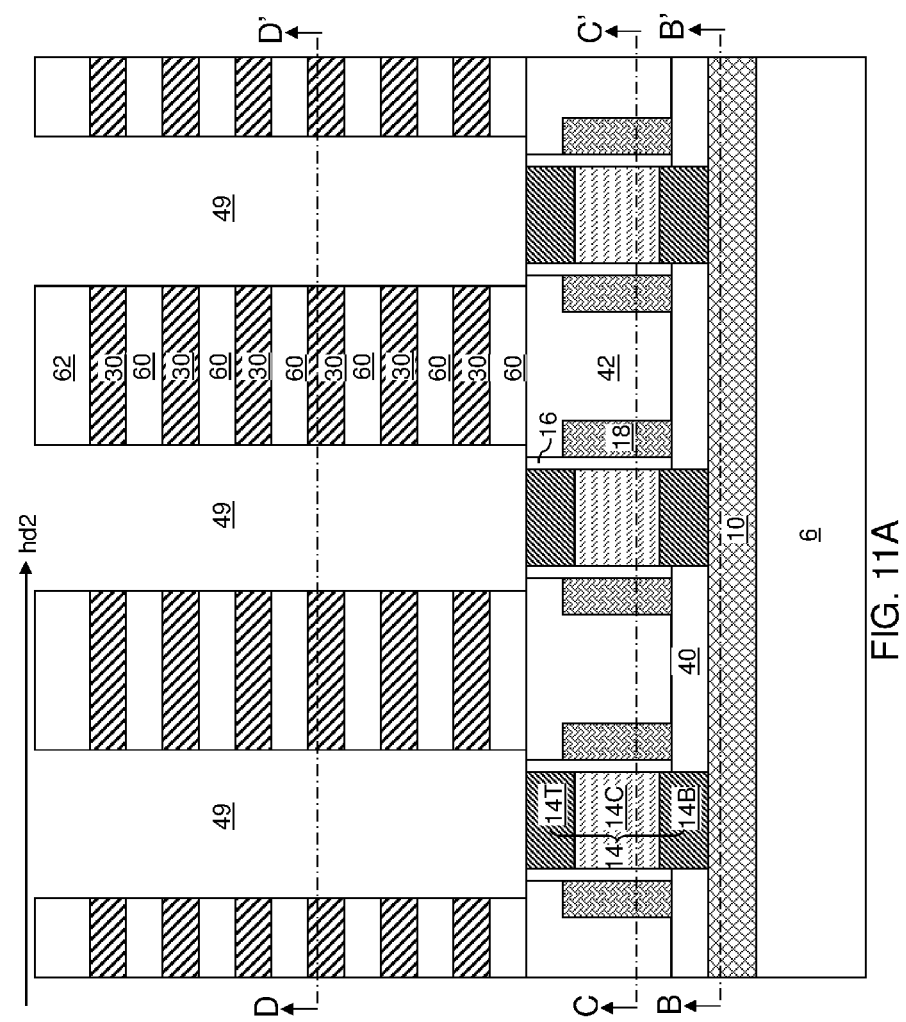
FIG. 11A is a vertical cross-sectional view of a first exemplary structure for forming a resistive random access memory device after formation of bit line access transistors, a dielectric fill layer, and a patterned alternating stack of insulating layers and conductive material layers according to an embodiment of the present disclosure.
Figure 11C:
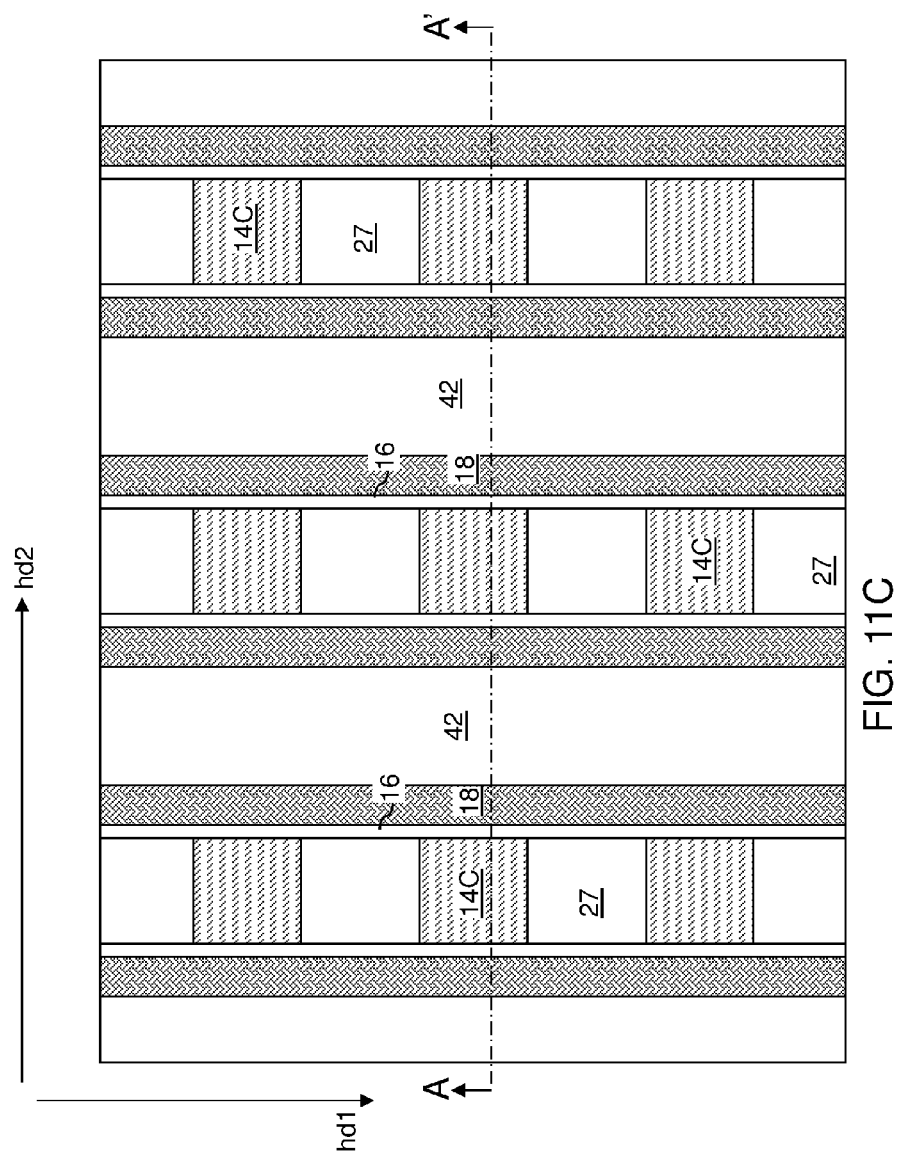
FIG. 11C is a horizontal cross-sectional view of the first exemplary structure of FIG. 11A along the horizontal plane C-C'. The vertical plane A-A' is the plane of the cross-section for FIG. 11A.
Figure 15A:
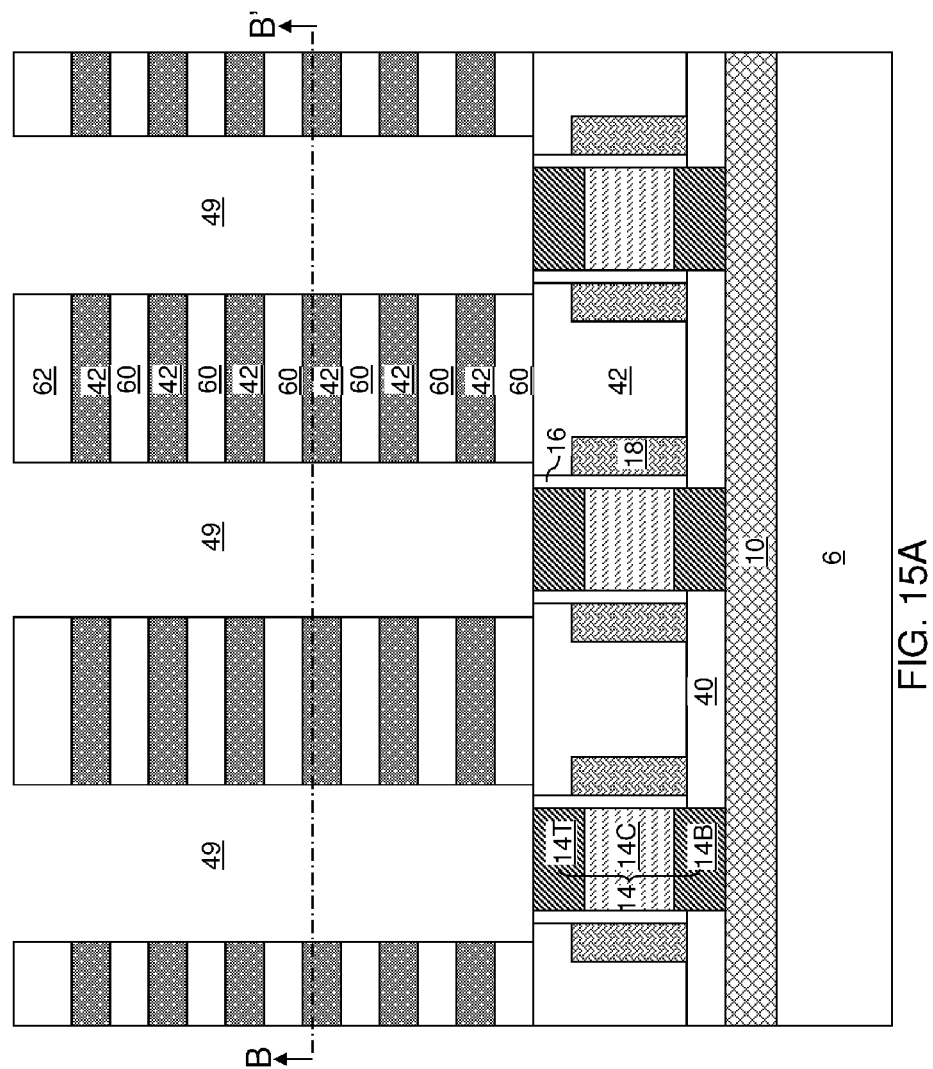
FIG. 15A is a vertical cross-sectional view of a second exemplary structure for forming a resistive random access memory device after formation of bit line access transistors, a dielectric fill layer, and a patterned alternating stack of insulating layers and sacrificial material layers according to an embodiment of the present disclosure.
Figure 16A:
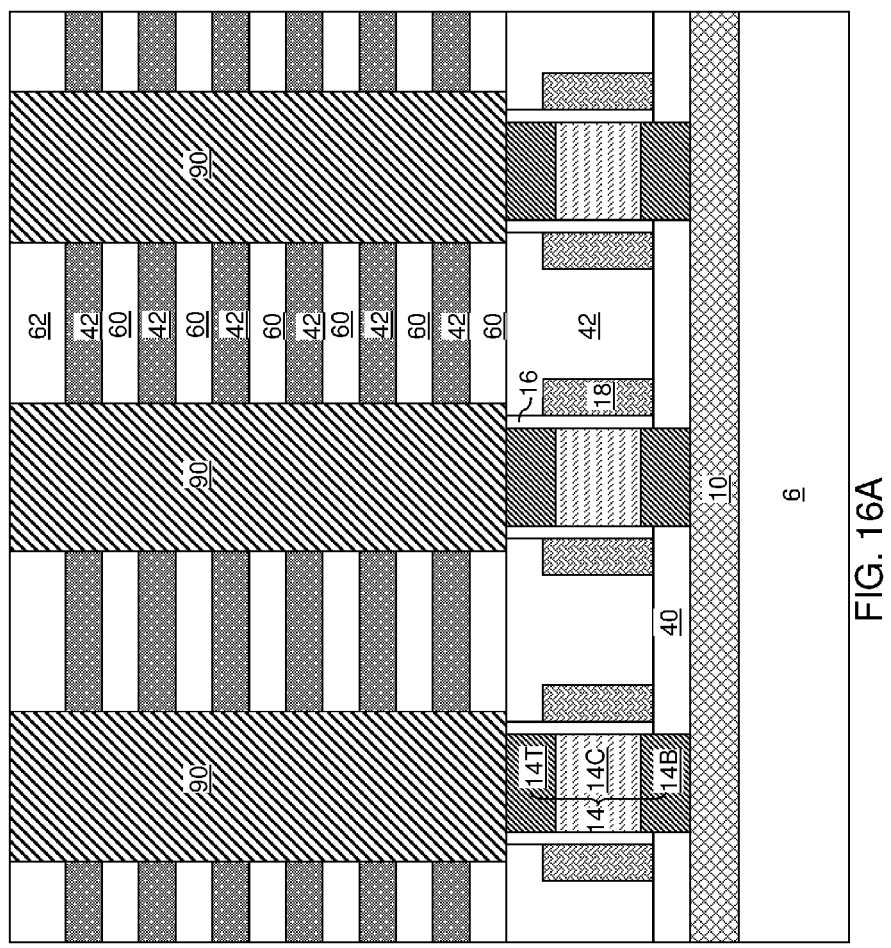
FIG. 16A is a vertical cross-sectional view of the second exemplary structure after formation of bit line structures according to an embodiment of the present disclosure.
Figure 16B:
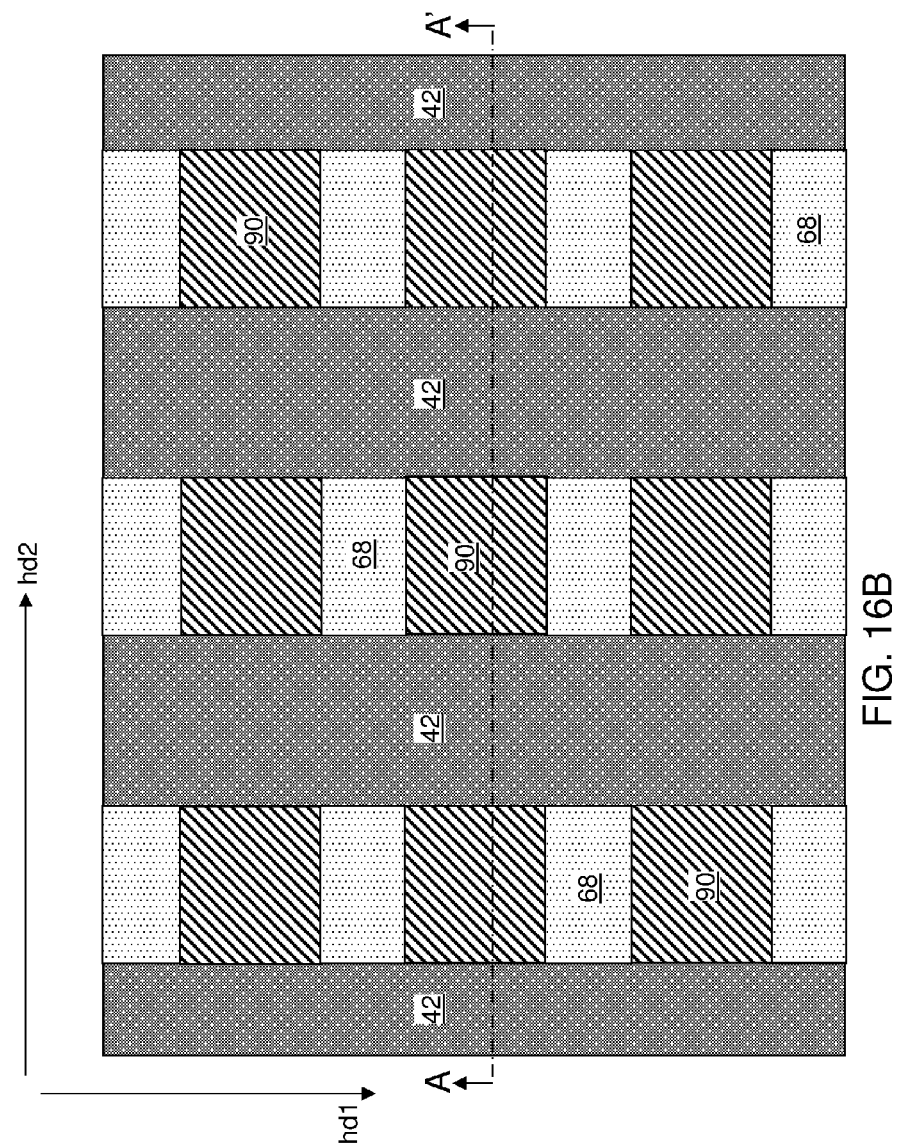
FIG. 16B is a horizontal cross-sectional view of second exemplary structure of FIG. 16A along the horizontal plane B-B'. The vertical plane A-A' is the plane of the cross-section for FIG. 16A.

Referring to FIGS. 15A and 15B, a second exemplary structure according to embodiment of the present disclosure can be derived from the first exemplary structure of FIGS. 11A 11D by replacing the word lines 30 with sacrificial material layers 42. The sacrificial material layers 42 have a different composition than the insulating layers 60 and the insulating cap layers 62 (as patterned from a continuous blanket layer into multiple insulating cap layers 62 upon formation of the line trenches 49). In one embodiment, the sacrificial material layers 42 can include germanium, a silicon-germanium alloy, amorphous or polycrystalline silicon, or silicon nitride. In case the sacrificial material layers 42 include silicon nitride, the insulating layers 60 and the insulating cap layers 62 can include undoped silicate glass (e.g., silicon oxide), and the separator pillar structures 68 to be subsequently formed can include organosilicate glass or doped silicate glass.

Figure 17:
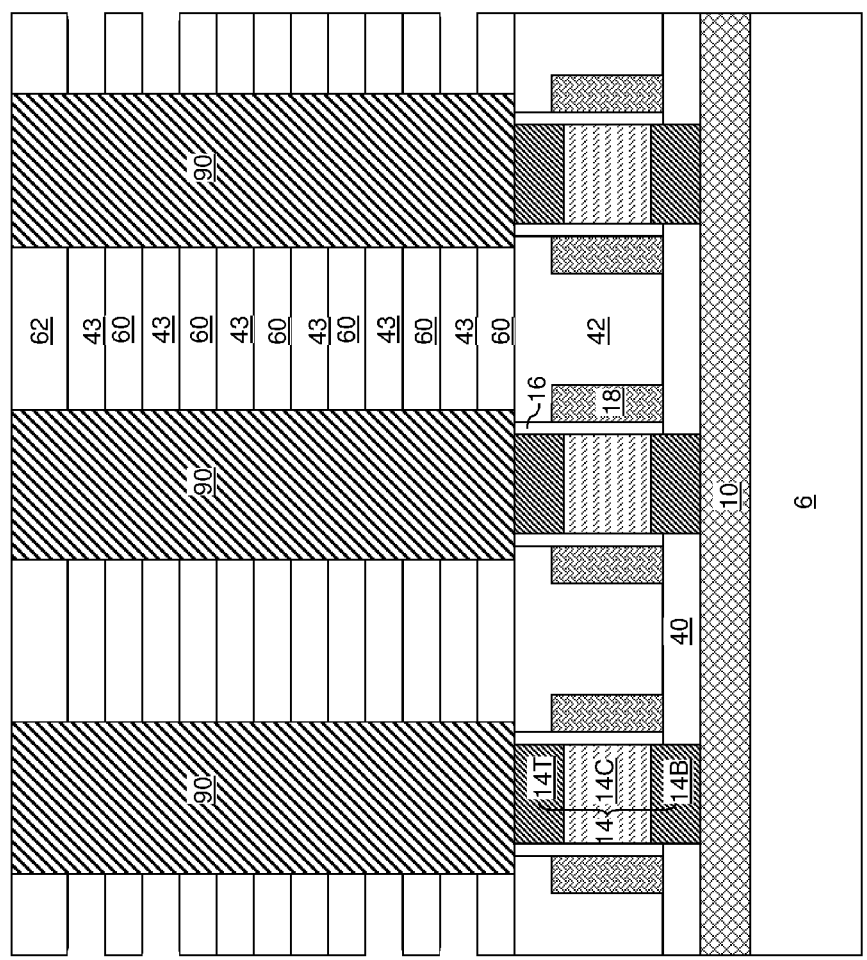
FIG. 17 is a vertical cross-sectional view of the second exemplary structure after formation of lateral recesses by removing the sacrificial material layers according to an embodiment of the present disclosure.

Referring to FIG. 17, the processing steps of FIGS. 12A, 12B, 13A, and 13B can be performed to form bit line cavities 47 and separator pillar structures 68, Subsequently, the processing steps for forming the resistive memory layer stacks 80 and the optional selector elements 380 may be performed. The resistive memory layer stack 80 includes a lateral stack of a barrier material portion 82 as embodied as a planar layer and a charge-modulated resistive memory material portions 86 as embodied as another planar layer as described above. Vertical bit lines 90 can be formed by deposition of at least one conductive material in the bit line cavities 47 employing the processing steps of FIGS. 14A and 14B. While the present disclosure is described employing an embodiment in which formation of the resistive memory layer stacks 80 and the optional selector elements 380 is omitted at this processing step, embodiments are expressly contemplated herein in which resistive memory layer stacks 80 and/or selector elements 380 are formed prior to formation of the vertical bit lines 90. In this case, subsequent processing sequence can be appropriately modified to avoid duplicate formation of resistive memory layer stacks 80 and/or selector elements 380.

An access trench (not shown) extending through the insulating cap layers 62 and the alternating stacks (42, 60) can be formed. An etchant that etches the material of the sacrificial material layers 42 selective to the material of the insulating layers 60, the insulating cap layers 62, and the vertical bit lines 90 (or resistive memory layer stacks 80 or selector elements 380 that contact sidewalls of the alternating stacks (42, 60)) can be introduced into the access trench. For example, if the sacrificial material layers 42 include germanium or a silicon-germanium alloy, a wet etch employing a combination of hydrogen peroxide and ammonium hydroxide can be employed to remove the sacrificial material layers 42. If the sacrificial material layers 42 include silicon nitride, a wet etch employing hot phosphoric acid can be employed to remove the sacrificial material layers 42. If the sacrificial material layers 42 include amorphous or polycrystalline silicon, a wet etch employing potassium hydroxide can be employed to remove the sacrificial material layers 42. Lateral recesses 43 can be formed in volumes from which the sacrificial material layers 42 are removed.

Figure 18:
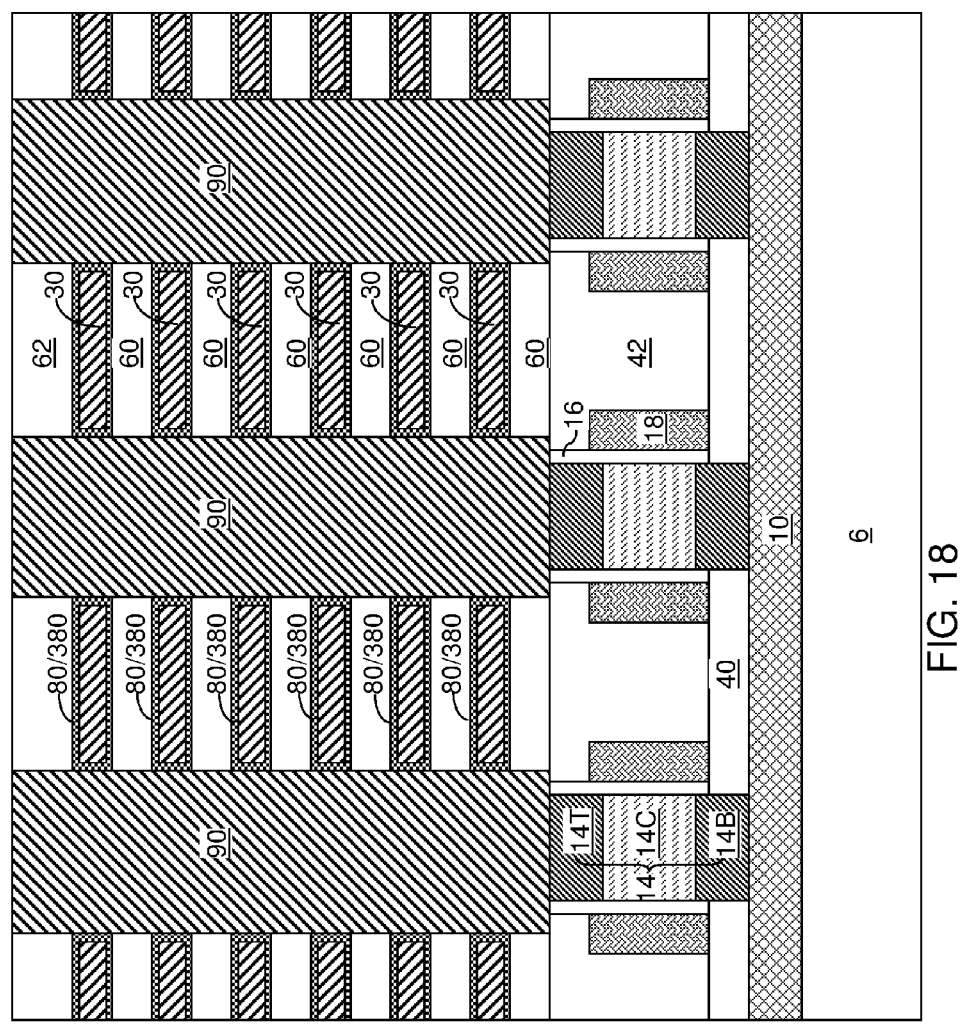
FIG. 18 is a vertical cross-sectional view of the second exemplary structure after formation of resistive memory layers and electrically conductive layers that constitute word lines of a resistive random access memory device according to an embodiment of the present disclosure.
Figure 19C:
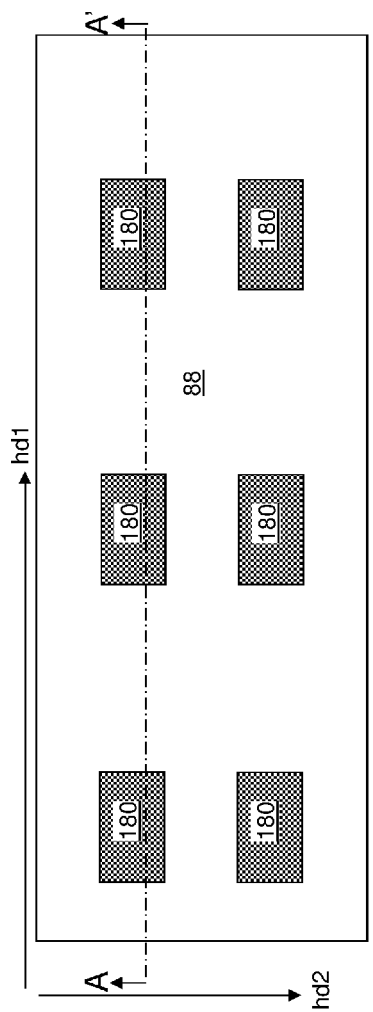
FIG. 19C is a horizontal cross-sectional view of the third exemplary structure of FIG. 19A along the horizontal plane C-C'. The vertical plane A-A' is the plane of the cross-section for FIG. 19A.
Figure 19D:
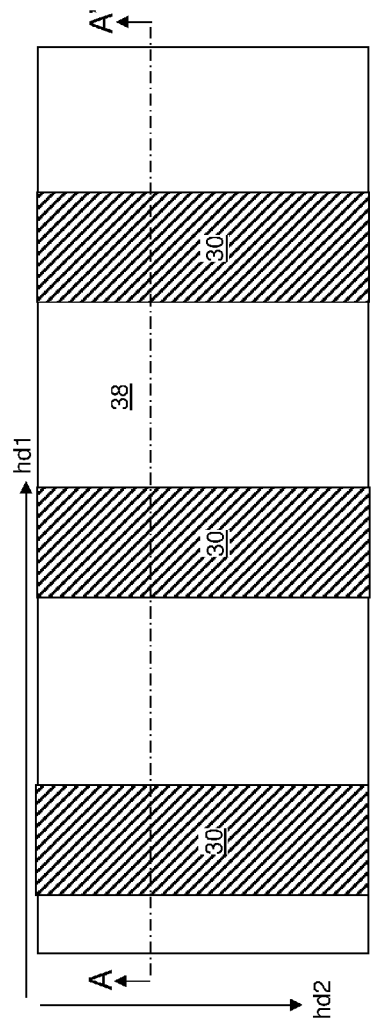
FIG. 19D is a horizontal cross-sectional view of the third exemplary structure of FIG. 19A along the horizontal plane D-D'. The vertical plane A-A' is the plane of the cross-section for FIG. 19A.

Referring to FIG. 18, if the resistive memory layer stacks 80 and/or the selector elements 380 are not previously formed within the bit line cavities 47, the resistive memory layer stacks 80 and/or the selector elements 380 can be formed in the lateral recesses 43 by deposition of suitable material layers. As discussed above, formation of selector elements 380 is optional. At least one conductive material can be deposited in remaining volumes of the lateral recesses 43 to form word lines 30, which can function as word lines of a resistive random access memory device.

Referring to FIGS. 19A-19D, a third exemplary structure is illustrated, which includes an array of resistive memory elements 180 in a criss-cross array configuration. Electrically conductive lines 30 having the same composition as the electrically conductive lines 30 of the first and second exemplary structures can be formed at a first level. The electrically conductive lines 30 can extend along a first horizontal direction hd1 and can be laterally spaced from one another along a second horizontal direction hd2 by portions of a first dielectric material layer 38.

Each resistive memory element 180 can have the same layer stack as the resistive memory layer stacks 80 of the first and second exemplary structures. Each resistive memory element 180 can be in a two-dimensional array configuration with a first periodicity along the first horizontal direction hd1 and a second periodicity along the second horizontal direction hd2, which may, or may not, be perpendicular to the first horizontal direction hd1. Optionally, a selector element 380 can be formed over (e.g., directly on or separated by an intervening layer), or under, each resistive memory element 180. Each selector element 380 can have the same layer stack as the selector element 380 of the first and second exemplary structures.

The resistive memory elements 180 and the selector elements 380 can be formed by deposition of material layers over a combination of the electrically conductive lines 30 and the first dielectric material layer 38, and by patterning the stack of material layers. Subsequently, a dielectric matrix layer 88 including a dielectric material (such as silicon oxide) can be deposited and planarized to physically expose a top surface of vertical stacks of a resistive memory element 180 and a selector element 380. Each vertical stack of a resistive memory element 180 and a selector element 380 may have the resistive memory element 180 on top, or the selector element 380 on top.

A second dielectric material layer 98 and horizontal bit lines 90 can be formed over the vertical stacks of a resistive memory element 180 and a selector element 380. The horizontal bit lines 90 can have the same composition as the vertical bit lines 90 of the first and second exemplary structures. The second dielectric material layer 98 includes a dielectric material such as silicon oxide. The electrically conductive lines 30 and the horizontal bit lines 90 form a grid array (e.g., cross bar array), and each vertical stack of a resistive memory element 180 and a selector element 380 can be located at the intersection point of the grid array to enable access by a combination of a selected electrically conductive line 30 and a selected horizontal bit line 180. The third exemplary structure can be integrated with a set of peripheral devices for controlling the electrically conductive lines 30 as word lines and the horizontal bit lines 90 as bit lines to provide a resistive random access memory device.

Figure 20:
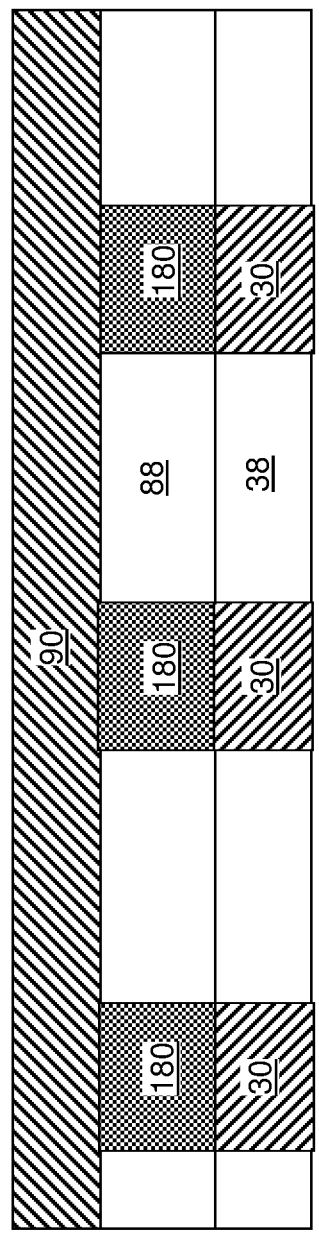
FIG. 20 is a vertical cross-sectional view of a modification of the third exemplary structure according to an embodiment of the present disclosure.

Referring to FIG. 20, a modification of the third exemplary structure is illustrated, which can be derived from the third exemplary structure by omitting the selector elements 380.

Figure 21:
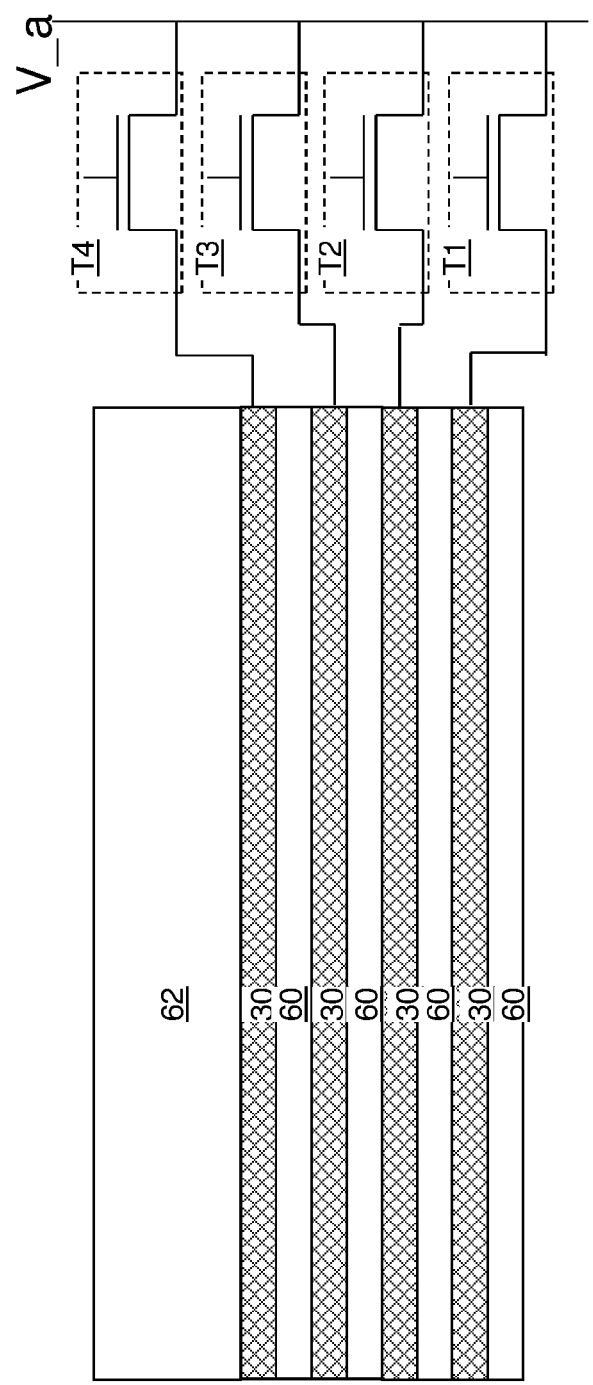
FIG. 21 is a schematic for word line access transistors connected to word lines in a resistive random access memory device.

Referring to FIG. 21, an exemplary peripheral device that can be employed to access the word lines 30 of the first and second exemplary structures (or the electrically conductive lines 30 of the third exemplary structure) as word lines. In this case, access transistors (T1-T4) can be employed, which can electrically bias each of the word lines 30 at a suitable electrical bias voltage (referred to as an access voltage V_a) for accessing a respective set of resistive memory elements. A similar scheme can be employed with the vertical field effect transistors (14B, 14C, 14T, 16, 18).

Referring collectively to all of the drawings of the present disclosure, a volatile resistive memory device is disclosed herein. The volatile resistive memory device includes a resistive memory element 180 including a barrier material portion 82 and a charge-modulated resistive memory material portion 86. In one embodiment, the device also include sense circuitry 270 configured to measure a resistive state of the resistive memory element 180 by measurement of an electrical current therethrough under a measurement bias condition (e.g., under read voltage), and data refresh circuitry configured to periodically refresh the resistive state of the resistive memory element 180 by rewriting stored data in the resistive memory element upon measurement of the stored data employing the sense circuitry 270.

In one embodiment, the data refresh circuitry can include: a latch configured to store data representing the resistive state of the resistive memory element 180 as measured employing the sense circuitry, and a level shifter configured to shift a voltage level of the data representing the resistive state of the resistive memory element 180 in the latch to another voltage level that reprograms the resistive memory element 180. In one embodiment, the resistive memory element 180 is reprogrammed during each refreshing of the resistive state of the resistive memory element by applying a programming pulse selected from a reset voltage that that causes a first type of ionic or vacancy motion so as to increase the resistance of the resistive memory element at a read voltage, and a set voltage that causes a second type of ionic or vacancy motion so as to decrease the resistance of the resistive memory element at the read voltage. In one embodiment, the reset voltage can deplete oxygen vacancies from an interface between the charge-modulated resistive memory material portion and the barrier material portion, and the set voltage can create oxygen vacancies in the charge-modulated resistive memory material portion. The reset voltage may be a positive reset voltage applied to the charge-modulated resistive memory material portion, and the set voltage may be a negative set voltage applied to the charge-modulated resistive memory material portion.

According to another aspect of the present disclosure, a resistive random access memory device is provided, which includes an array of multiple instances of the resistive memory element 180 of the present disclosure, the sense circuitry, and the data refresh circuitry. The sense circuitry is configured to measure a resistive state of each of the resistive memory elements 180, and the data refresh circuitry is configured to periodically refresh the resistive state of each of the resistive memory elements 180.

According to another aspect of the present disclosure, a volatile resistive memory device comprising a resistive memory element 180 is provided. The resistive memory element 180 comprises a barrier material portion 82 and a charge-modulated resistive memory material portion 86. The barrier material portion 82 comprises a material selected from germanium and silicon-germanium (e.g., a silicon and germanium alloy/compound semiconductor material), such as amorphous germanium and silicon-germanium. The charge-modulated resistive memory material portion 86 comprises a non-filamentary, electrically conductive metal oxide, which in one embodiment comprises sub-stoichiometric titanium oxide.

The volatile resistive memory device can be used as a DRAM, for example as an eDRAM in a computer or another electronic device. The device of various embodiments may provide low switching currents of about 1 microAmp for 20 nm devices, high speed switching (e.g., less than 100 ns, such as 50 ns to 75 ns switching), good endurance (>4 million cycles) and reduced power as the refresh time can be greater than 64 ms (e.g., 100 ms to 1 ms, such as 1 to 10 times a second). In other words, the data refresh circuitry periodically refreshes the resistive state of the resistive memory element at an interval greater than 64 ms, such as 100 ms to 1 ms (e.g., 1 to 10 times a second).

In one embodiment, the volatile resistive memory device can employ a one-transistor one-resistor (1T1R) as the configuration for the embedded dynamic random access memory (DRAM). In this case, multiple instances of a unit memory cell having a configuration of FIG. 1B can be arranged in an array configuration such as the configuration illustrated in FIG. 3. In one embodiment, the transistor can be formed on a semiconductor substrate as a planar field effect transistor or fin field effect transistor having a respective horizontal semiconductor channel, or can be formed as a vertical field effect transistor having a vertical semiconductor channel Each resistive memory element in the resistor can be formed in one of the upper metal levels to provide a unit cell having the 1T1R configuration.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device comprising a resistive memory element, wherein:
   the resistive memory element comprises a barrier material portion and a charge-modulated resistive memory material portion;
   the barrier material portion comprises a material selected from germanium and silicon-germanium;
   the charge-modulated resistive memory material portion comprises a non-filamentary, electrically conductive metal oxide;
   a sense circuitry configured to measure a resistive state of the resistive memory element by measurement of an electrical current therethrough under a read voltage; and
   a data refresh circuitry configured to periodically refresh the resistive state of the resistive memory element by rewriting stored data in the resistive memory element upon measurement of the stored data employing the sense circuitry;
   wherein:
   the resistive memory device comprises a volatile eDRAM device;
   the resistive memory device has a one-transistor one-resistor (1T1R) configuration for the eDRAM;
   the data refresh circuitry comprises:
      a latch configured to store data representing the resistive state of the resistive memory element as measured employing the sense circuitry; and
      a level shifter configured to shift a voltage level of the data representing the resistive state of the resistive memory element in the latch to another voltage level that reprograms the resistive memory element;
   each read operation does not require a corresponding refresh operation and the read operation does not disturb a resistance state of the charge-modulated resistive memory material portion;
   the data refresh circuitry periodically refreshes the resistive state of the resistive memory element at an interval greater than 64 ms; and
   the resistive memory element is reprogrammed during each refreshing of the resistive state of the resistive memory element by applying a programming pulse having a voltage selected from:
      a positive reset voltage applied to the charge-modulated resistive memory material portion that depletes oxygen vacancies from an interface between the charge-modulated resistive memory material portion and the barrier material portion; and a negative set voltage applied to the charge-modulated resistive memory material portion that creates oxygen vacancies in the charge-modulated resistive memory material portion.

2. The resistive memory device of claim 1, wherein the non-filamentary, electrically conductive metal oxide comprises sub-stoichiometric titanium oxide, and the barrier material portion comprises a material selected from amorphous germanium and amorphous silicon-germanium.

3. The resistive memory device of claim 2, wherein the barrier material portion comprises the amorphous germanium.

4. The resistive memory device of claim 2, wherein the barrier material portion comprises the amorphous silicon-germanium.

5. The resistive memory device of claim 1, wherein the programming pulse comprises the positive reset voltage.

6. The resistive memory device of claim 1, wherein the programming pulse comprises the negative set voltage.

* * * * *